United States Patent
Morris et al.

(10) Patent No.: US 11,450,675 B2
(45) Date of Patent: Sep. 20, 2022

(54) ONE TRANSISTOR AND ONE FERROELECTRIC CAPACITOR MEMORY CELLS IN DIAGONAL ARRANGEMENTS

(71) Applicant: Intel Corporation, Santa Clara, CA (US)

(72) Inventors: Daniel H. Morris, San Francisco, CA (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 16/132,281

(22) Filed: Sep. 14, 2018

(65) Prior Publication Data

US 2020/0091162 A1    Mar. 19, 2020

(51) Int. Cl.
   *G11C 11/22* (2006.01)
   *H01L 27/11507* (2017.01)
   (Continued)

(52) U.S. Cl.
   CPC ...... *H01L 27/11507* (2013.01); *G11C 11/221* (2013.01); *G11C 11/2255* (2013.01);
   (Continued)

(58) Field of Classification Search
   CPC ........... G11C 11/221; H01L 21/823431; H01L 27/0886; H01L 29/66795; H01L 29/785
   See application file for complete search history.

(56) References Cited

U.S. PATENT DOCUMENTS

| 5,218,568 A | 6/1993 | Lin et al. |
| 5,412,596 A | 5/1995 | Hoshiba |

(Continued)

FOREIGN PATENT DOCUMENTS

| WO | 2018111215 A1 | 6/2018 |
| WO | 2018125024 A1 | 7/2018 |

OTHER PUBLICATIONS

PCT Jul. 28, 2017 International Search Report and Written Opinion of the International Search Authority from International Application No. PCT/US2016/066056 dated Jul. 28, 2017, 10 pages.
(Continued)

*Primary Examiner* — Uyen Smet
(74) *Attorney, Agent, or Firm* — Akona IP

(57) ABSTRACT

Described herein are one access transistor and one ferroelectric capacitor (1T-1FE-CAP) memory cells in diagonal arrangements, as well as corresponding methods and devices. When access transistors of memory cells are implemented as FinFETs, then, in a first diagonal arrangement, memory cells are arranged so that the BLs for the cells are diagonal with respect to the fins of the access transistors of the cells, while the WLs for the cells are perpendicular to the fins. In a second diagonal arrangement, memory cells are arranged so that the fins of the access transistors of the cells are diagonal with respect to the WLs for the cells, while the BLs for the cells are perpendicular to the WLs. Such diagonal arrangements may advantageously allow achieving high layout densities of 1T-1FE-CAP memory cells and may benefit from the re-use of front-end transistor process technology with relatively minor adaptations.

25 Claims, 15 Drawing Sheets

(51) Int. Cl.
  *H01L 27/108*  (2006.01)
  *H01L 23/522*  (2006.01)
  *H01L 23/532*  (2006.01)

(52) U.S. Cl.
  CPC ...... *G11C 11/2257* (2013.01); *G11C 11/2259* (2013.01); *G11C 11/2273* (2013.01); *G11C 11/2275* (2013.01); *H01L 23/5223* (2013.01); *H01L 23/5226* (2013.01); *H01L 23/5329* (2013.01); *H01L 27/10808* (2013.01)

(56) References Cited

U.S. PATENT DOCUMENTS

| | | |
|---|---|---|
| 5,515,311 A | 5/1996 | Mihara |
| 5,600,587 A * | 2/1997 | Koike .................. G11C 11/22 |
| | | 365/145 |
| 9,773,728 B1 * | 9/2017 | Juengling ............. H01L 23/528 |
| 2005/0199913 A1 * | 9/2005 | Hofmann .............. H01L 27/115 |
| | | 257/204 |
| 2006/0268597 A1 | 11/2006 | Sakuma |
| 2008/0048226 A1 | 2/2008 | Heo et al. |
| 2008/0121956 A1 | 5/2008 | Kanaya |
| 2010/0321975 A1 | 12/2010 | Kimura et al. |
| 2012/0040528 A1 * | 2/2012 | Kim .................... H01L 21/0338 |
| | | 438/675 |
| 2012/0314476 A1 | 12/2012 | Appenzeller et al. |
| 2016/0027490 A1 | 1/2016 | Müller |
| 2018/0182763 A1 * | 6/2018 | Juengling ........... H01L 27/0886 |

OTHER PUBLICATIONS

PCT Aug. 28, 2017 International Search Report and Written Opinion of the International Search Authority from International Application No. PCT/US2016/068615 dated Aug. 28, 2017, 10 pages..

* cited by examiner

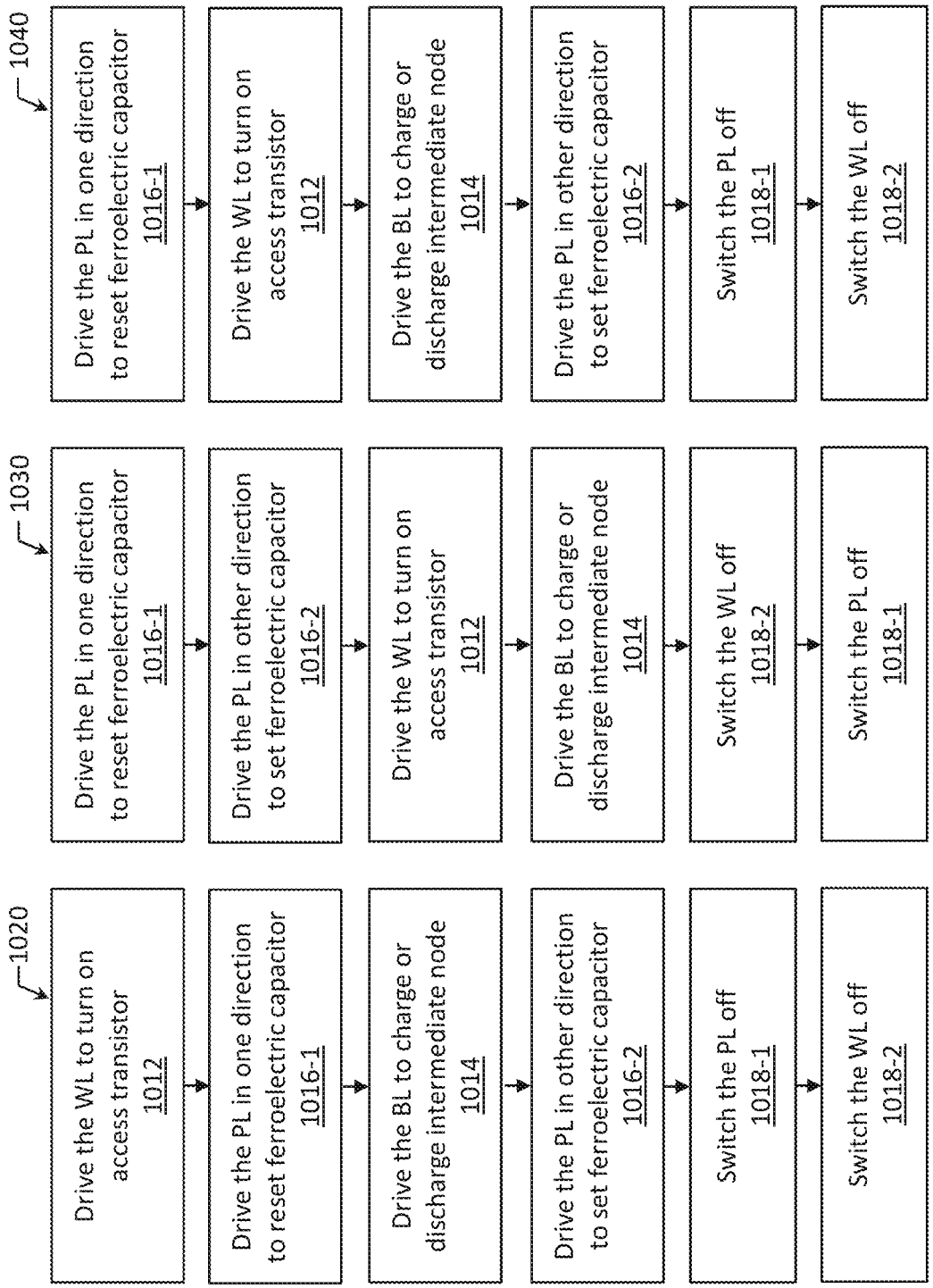

ONE TRANSISTOR AND ONE FERROELECTRIC CAPACITOR MEMORY CELLS IN DIAGONAL ARRANGEMENTS

BACKGROUND

Dense low power embedded memory is used in many different computer products. Non-volatile operation by embedded memory is a desirable attribute to reduce standby power.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 10-12 are flow diagrams of example methods for programming a 1T-1FE-CAP memory cell, in accordance with various embodiments.

DETAILED DESCRIPTION

Overview

Figure 1:
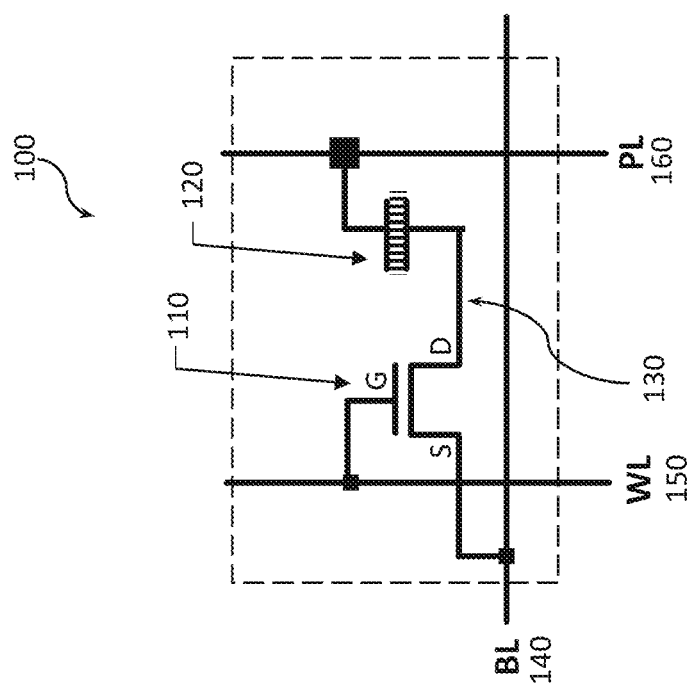
FIG. 1 is a schematic illustration of a one access transistor (1T) and one ferroelectric capacitor (1FE-CAP) (1T-1FE-CAP) memory cell, according to some embodiments of the present disclosure.

As described above, non-volatile operation by embedded memory is a desirable attribute to reduce standby power. However, known memories do not provide non-volatility, low power, and high switching speeds in one type of memory. For example, static random-access memory (SRAM) is a high speed volatile memory but it consumes leakage power from an always-on power supply. Embedded dynamic random-access memory (embedded DRAM, or eDRAM) is another high speed volatile memory that consumes dynamic power from refresh operations.

Lower standby power is exhibited by some non-volatile memories. For example, embedded flash (eFlash), magnetic random-access memory (MRAM), and resistive random-access memory (RRAM) are non-volatile memories that exhibit low standby power but are unlikely to reach the performance level (i.e., SRAM-comparable fast READ and WRITE operations at low power) required for many applications. Further, endurance of current non-volatile memories is low and write energy too high.

Improvements on one or more challenges described above are always desirable.

Described herein are ferroelectric memory cells and corresponding methods and devices. Ferroelectric memory refers to a memory technology employing ferroelectric materials. A ferroelectric material is a material that exhibits, over some range of temperatures, a spontaneous electric polarization, i.e., displacement of positive and negative charges from their original position, which can be reversed or reoriented by application of an electric field. Because the displacement of the charges in ferroelectric materials can be maintained for some time even in the absence of an electric field, such materials may be used to implement memory cells. The term "ferroelectric" is said to be adopted to convey the similarity of ferroelectric memories to conventional ferromagnetic memories, despite the fact that there is no iron (Fe) in most ferroelectric materials.

Ferroelectric memories have the potential for adequate non-volatility, short programming time, low power consumption, high endurance, and high speed writing. In addition, ferroelectric memories may be manufactured using processes compatible with the standard complementary metal-oxide-semiconductor (CMOS) technology. Therefore, over the last few years, these types of memories have emerged as promising candidates for many growing applications such as digital cameras and contactless smart cards.

The performance of a ferroelectric memory cell may depend on the number of factors. One factor is the ability of a cell to prevent or minimize detrimental effects of voltages which may unintentionally disturb a polarization state that a cell is supposed to hold. Unlike ferromagnetic cores which have square-like hysteresis loops with sharp transitions around their coercive points, as is desirable for memory implementations, hysteresis loops of ferroelectric materials do not have sharp transitions which means that even relatively small voltages can inadvertently disturb their polarization states. One approach to address this issue could be to improve processing techniques for creating ferroelectric materials in an attempt to create materials having square-like hysteresis loops. Another approach is to overcome this shortcoming of the materials with employing creative circuit architectures, e.g., by using access transistors to control access to ferroelectric cells.

Each of ferroelectric memory cells described herein includes one access transistor (1T) and one ferroelectric capacitor (1FE-CAP) and, may, therefore, be referred to as 1T-1FE-CAP cell, 1T-1FE-CAP memory cell, or 1T-1FE-CAP bit-cell. The access transistor may be coupled to the ferroelectric capacitor by sharing its source/drain terminal with one electrode of the ferroelectric capacitor and may be used for both READ and WRITE accesses to the ferroelectric capacitor. The ferroelectric material employed in the ferroelectric capacitor may be one of the novel materials exhibiting ferroelectric behavior at thin dimensions (i.e., also in thin films), such as hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), and yttrium-doped (Y-doped) hafnium oxide (which is a material that includes hafnium, oxygen, and yttrium). The ferroelectric capacitor may have a three-dimensional geometry, e.g., a cylindrical capacitor or a rectangular prism capacitor, possibly with rounded corners.

For example, the access transistor of a 1T-1FE-CAP memory cell could be a FinFET. FinFETs refer to transistors having a non-planar architecture where a fin, formed of one or more semiconductor materials, extends away from a base. FinFETs are sometimes referred to as "FinFETs," where the name "tri-gate" originates from the fact that, in use, such a transistor may form conducting channels on three "sides" of the fin, although, in principle, a FinFET may be operated with less than three channels. FinFETs potentially improve performance relative to single-gate transistors and double-gate transistors and, therefore, have been used extensively in logic technology.

Described herein are 1T-1FE-CAP memory arrays (i.e., memory arrays employing 1T-1FE-CAP memory cells) in diagonal arrangements. For example, when the access transistors of 1T-1FE-CAP memory cells are implemented as FinFETs, then, in a first diagonal arrangement described herein, 1T-1FE-CAP memory cells may be arranged so that the bitlines (BLs) for the cells are diagonal with respect to the fins of the access transistors of the memory cells, while the wordlines (WLs) for the cells are perpendicular to the fins. In a second diagonal arrangement described herein, 1T-1FE-CAP memory cells may be arranged so that the fins of the access transistors of the memory cells are diagonal with respect to the WLs for the cells, while the BLs for the cells are perpendicular to the WLs. Such diagonal arrangements may advantageously allow achieving high layout densities of 1T-1FE-CAP memory cells and may benefit from the re-use of front-end transistor process technology with relatively minor adaptations. Consequently, memory cells proposed herein are compatible with very short gate length technology nodes. Other technical effects will be evident from various embodiments described here.

As used herein, the term "diagonal angle" refers to an angle between two elongated elements which are not parallel or perpendicular to one another, i.e., an angle between about 5 and 85 degrees, e.g., an angle between about 5 and 45 degrees, or between about 10 and 30 degrees. A first elongated element of a memory array may be described to be "diagonal" with respect to a second elongated element if, in a layout view (i.e., in a two-dimensional (2D) view of the design architecture), the first element is at a diagonal angle with respect to the second element. When at least a portion of the first elongated element is in a different plane above the substrate on which a memory array is implemented than a plane of at least a portion of the second elongated element (i.e., first and second elements are at different z-heights above the substrate), then the diagonal angle between these elements is understood to be the angle between geometric projections of these elements onto a given common plane that is parallel to the substrate. Thus, for example, a BL is said to be "diagonal" with respect to a fin on which one, but typically a plurality, of FinFETs used as access transistors of 1T-1FE-CAP memory cells are implemented if a projection of the BL on a certain plane parallel to the substrate (e.g., a projection on the plane of the substrate) is at a diagonal angle with respect to a projection of the fin onto the same plane (while a projection of the associated WL onto the same plane is substantially perpendicular to the projection of the fin). In another example, a fin is said to be "diagonal" with respect to a WL, if a projection of the fin on a certain plane parallel to the substrate (e.g., a projection on the plane of the substrate) is at a diagonal angle with respect to a projection of the associated BL onto the same plane (while a projection of the BL onto the same plane is substantially perpendicular to the projection of the WL).

In the following detailed description, various aspects of the illustrative implementations may be described using terms commonly employed by those skilled in the art to convey the substance of their work to others skilled in the art. For example, the term "connected" means a direct electrical connection between the things that are connected, without any intermediary devices, while the term "coupled" means either a direct electrical connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a ferroelectric memory cell refers to one of a finite number of states that the cell can have, e.g., logic states "1" and "0," each state represented by a different polarization of the ferroelectric material of the cell. The terms "READ" and "WRITE" memory access or operations refer to, respectively, determining/sensing a logic state of a memory cell and programming/setting a logic state of a memory cell.

If used herein, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/− 20% of a target value based on the context of a particular value as described herein or as known in the art. Similarly, terms indicating orientation of various elements, e.g., "coplanar," "perpendicular,"

"orthogonal," "parallel," or any other angle between the elements, generally refer to being within +/− 5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. The accompanying drawings are not necessarily drawn to scale. It is to be understood that other embodiments may be utilized, and structural or logical changes compared to what is shown in the drawings may be made, without departing from the scope of the present disclosure. Therefore, the following detailed description is not to be taken in a limiting sense. For convenience, if a collection of drawings designated with different letters are present, e.g., FIGS. 14A-14B, such a collection may be referred to herein without the letters, e.g., as "FIG. 14."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various 1T-1FE-CAP memory cells in diagonal arrangements as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

Example 1T-1FE-CAP Memory Cell

FIG. 1 is a schematic illustration of a 1T-1FE-CAP memory cell 100 according to some embodiments of the present disclosure. As shown, the 1T-1FE-CAP cell 100 may include an access transistor 110 and a ferroelectric capacitor 120. The access transistor 110 has a gate terminal, a source terminal, and a drain terminal, indicated in the example of FIG. 1 as terminals G, S, and D, respectively. In the following, the terms "terminal" and "electrode" may be used interchangeably.

As shown in FIG. 1, in the 1T-1FE-CAP cell 100, the gate terminal of the access transistor 110 is coupled to a WL 150, one of the source or drain (S/D) terminals of the access transistor 110 is coupled to a BL 140, and the other one of the S/D terminals of the access transistor 110 is coupled to a first electrode of the ferroelectric capacitor 120. The other electrode of the ferroelectric capacitor 120 is coupled to a capacitor plateline (PL) 160. As described in greater detail below, WL, BL, and PL may be used together to read and program the ferroelectric capacitor 120. In the following, the electrode of the ferroelectric capacitor 120 coupled to the PL is referred to as a "first capacitor electrode" while the electrode of the ferroelectric capacitor 120 coupled to the access transistor is referred to as a "second capacitor electrode."

Each of the BL 140, the WL 150, and the PL 160, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

An intermediate node 130, described in greater detail below, refers to the S/D terminal of the access transistor 110 that is coupled to the second capacitor electrode of the ferroelectric capacitor 120, as indicated in FIG. 1.

As is commonly known, source and drain terminals are interchangeable in transistors. Therefore, while the example of FIG. 1 illustrates that the transistor 110 is coupled to the ferroelectric capacitor 120 by its drain terminal, in other embodiments, any one of a source or a drain terminal of the transistor 110 may be coupled to the second electrode of the ferroelectric capacitor 120. A source and a drain terminal of a transistor is sometimes referred to in the following as a "transistor terminal pair" and a "first terminal" of a transistor terminal pair is used to describe, for the access transistor 110, the S/D terminal that is connected to the BL 140, while a "second terminal" is used to describe the S/D terminal of the access transistor 110 that is connected to the second capacitor electrode of the ferroelectric capacitor 120.

Instead of a regular dielectric material used in conventional dielectric (i.e., not ferroelectric) capacitors, the ferroelectric capacitor 120 includes a ferroelectric material, also referred to as ferroelectric element.

As described above, the access transistor 110 may be a FinFET. In a FinFET, sides of a portion of a fin that is closest to a base are enclosed by a dielectric material, typically an oxide, commonly referred to as a "shallow trench isolation" (STI). A gate stack that includes a stack of one or more gate electrode metals and a stack of one or more gate dielectrics is provided over the top and sides of the remaining upper portion of the fin (i.e., the portion above the STI), thus wrapping around the upper portion of the fin and forming a three-sided gate of a FinFET. The portion of the fin that is enclosed by the STI is referred to as a "sub-fin" while the portion of the fin over which the gate stack wraps around is referred to as a "channel" or a "channel portion." A semiconductor material of which the channel portion of the fin is formed is commonly referred to as a "channel material." A source region and a drain region are provided on the opposite ends of the fin, on either side of the gate stack, forming, respectively, a source and a drain of such a transistor.

Figure 2:
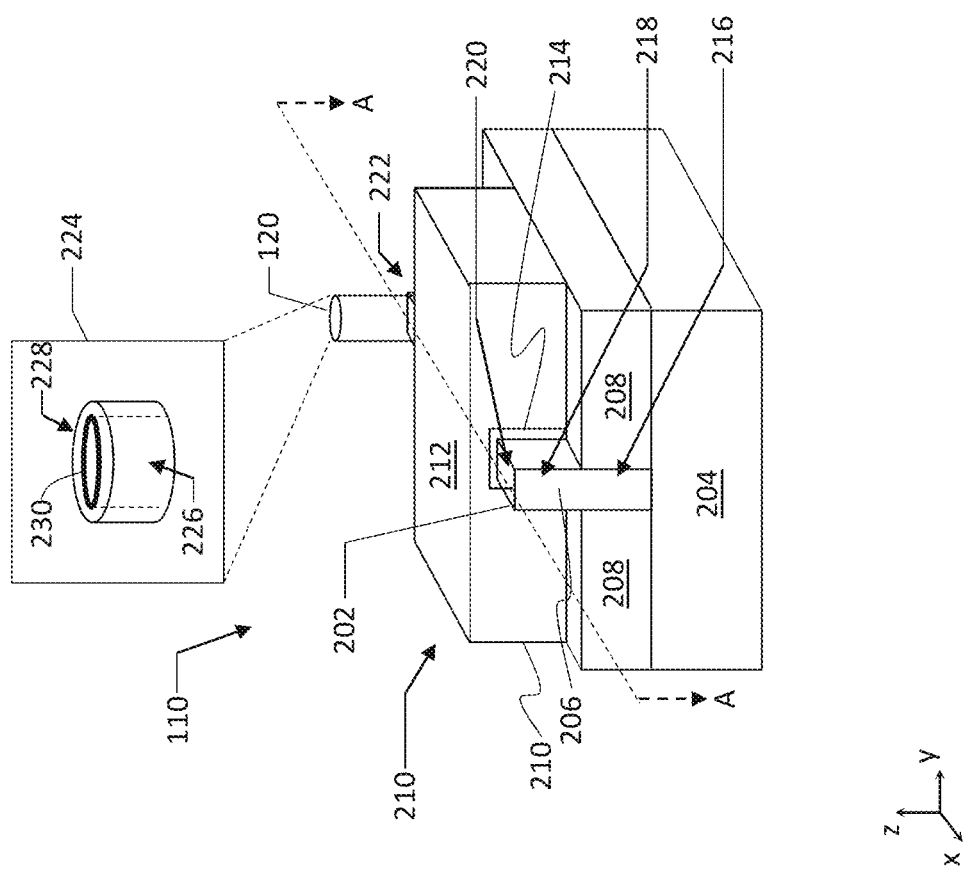
FIG. 2 is a perspective view of an example 1T-1FE-CAP memory cell having a fin-based field-effect transistor (FinFET) access transistor and a ferroelectric capacitor, according to some embodiments of the present disclosure.

FIG. 2 is a perspective view of an example 1T-1FE-CAP memory cell 100 having a FinFET access transistor 110 with a fin 202, and a ferroelectric capacitor 120 coupled to the access transistor 110, according to some embodiments of the present disclosure. Although a single memory cell 100 is illustrated in FIG. 2, this is simply for ease of illustration, and, as shown in subsequent illustrations of memory arrays (e.g. FIG. 3), any greater number of memory cells 100 may be provided along a single fin 202 according to various embodiments of the present disclosure. Furthermore, note that the arrangement shown in FIG. 2 (and subsequent figures showing various views of memory arrays) is intended to show relative arrangements of some of the components therein, and that the arrangement with the memory cell 100, or portions thereof, may include other components that are not illustrated (e.g., electrical contacts to the source and the drain of the transistor 110, additional layers such as a spacer layer, around the gate electrode of the transistor 110, etc.).

As shown, the FinFET access transistor 110 of FIG. 2 may include a base 204, and a semiconductor channel material 206 extending away from the base 204, the semiconductor channel material 206 being shaped as the fin 202. FIG. 2 further illustrates a transistor dielectric material 208, and a gate stack 210 comprising a gate electrode material 212 (which could include a stack of one or more gate electrode materials) and a gate dielectric 214 (which could include a stack of one or more gate dielectric materials). In some embodiments, the gate dielectric 214 may be in contact with the semiconductor channel material 206 and the gate electrode material 212 may be in contact with the gate dielectric 214.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device may be built falls within the spirit and scope of the present disclosure. In various embodiments the base 204 may include any such substrate that provides a suitable surface for providing the arrangement having the memory cell 100.

The transistor dielectric material 208 forms an STI disposed on either side of the fin 202. A portion of the fin 202 enclosed by the STI 208 forms a sub-fin 216. The STI material 208 may be a high-k dielectric including elements such as hafnium, silicon, oxygen, titanium, tantalum, lanthanum, aluminum, zirconium, barium, strontium, yttrium, lead, scandium, niobium, and zinc. Examples of high-k materials that may be used in the STI material 208 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

The gate stack 210 may wrap around the fin 202 as shown, with a channel portion 218 corresponding to the portion of the channel material of the fin 202 wrapped by the gate stack 210. In particular, the gate dielectric 214 may wrap around the channel material 206 of the fin 202, and the gate electrode material 212 may wrap around the gate dielectric 214. The channel portion 218 may be considered to end and the sub-fin portion 216 may be considered to begin where the gate electrode 212 ends, which is typically where the STI 208 begins.

The gate electrode material 212 may include at least one P-type work function metal or N-type work function metal, depending on whether the access transistor 110 is a P-type metal-oxide-semiconductor (PMOS) transistor or an N-type metal-oxide-semiconductor (NMOS) transistor (P-type work function metal used as the gate electrode 212 when the access transistor 110 is a PMOS transistor and N-type work function metal used as the gate electrode 212 when the access transistor 110 is an NMOS transistor). For a PMOS transistor, metals that may be used for the gate electrode material 212 may include, but are not limited to, ruthenium, palladium, platinum, cobalt, nickel, and conductive metal oxides (e.g., ruthenium oxide). For an NMOS transistor, metals that may be used for the gate electrode material 212 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 212 may consist of a stack of two or more metal layers, where one or more metal layers are work function metal layers and at least one metal layer is a fill metal layer. Further layers may be included next to the gate electrode material 212 for other purposes, such as to act as a diffusion barrier layer or/and an adhesion layer.

In some embodiments, the gate dielectric 214 may include one or more high-k dielectrics including any of the materials discussed herein with reference to the STI material 208. In some embodiments, an annealing process may be carried out on the gate dielectric 214 during manufacture of the access transistor 110 to improve the quality of the gate dielectric 214. The gate dielectric 214 may have a thickness, a dimension measured in the direction of the y-axis of the reference coordinate system x-y-z shown in FIG. 2, that may, in some embodiments, be between about 0.5 nanometers and 3 nanometers, including all values and ranges therein (e.g., between about 1 and 3 nanometers, or between about 1 and 2 nanometers). In some embodiments, the gate stack 210 may be surrounded by a gate spacer, not shown in FIG. 2. Such a gate spacer would be configured to provide separation between the gate stack 210 and source/drain contacts of a transistor and could be made of a low-k dielectric material (i.e., a dielectric material that has a lower dielectric constant than silicon dioxide). Some examples of low-k dielectric materials include, but are not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. A gate spacer may include pores or air gaps to further reduce its dielectric constant.

The channel material 206 of the fin 202 may be composed of semiconductor material systems including, for example, N-type or P-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. The channel material may include a combination of semiconductor materials where one semiconductor material is used for the channel portion 218 of the fin 202 and another material, sometimes referred to as a "blocking material," is used for the sub-fin 216. Such a blocking material may be used sometimes to reduce or eliminate sub-fin leakage, an undesirable phenomenon when some of the current is conducted in the sub-fin. In some embodiments, the sub-fin 216 and the channel portion 218 are each formed of monocrystalline semiconductors. In a first embodiment, the sub-fin 216 and the channel portion 218 are each formed of compound semiconductors with a first sub-lattice of at least one element from group III of the periodic table (e.g., Al, Ga, In), and a second sub-lattice of at least one element of group V of the periodic table (e.g., P, As, Sb). The sub-fin 216 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth. For example N-type transistor embodiments, the channel portion 218 is advantageously a III-V material having a high electron mobility, such as but not limited to InGaAs, InP, InSb, and InAs. For some such embodiments, the channel portion 218 is a ternary III-V alloy, such as InGaAs or GaAsSb. For some $In_xGa_{1-x}As$ fin embodiments, the In content (x) is between 0.6 and 0.9, and advantageously is at least 0.7 (e.g., $In_{0.7}Ga_3As$). In some embodiments with highest mobility, the channel portion 218 is intrinsic III-V material and not intentionally doped with any electrically active impurity. In alternate embodiments, a nominal impurity dopant level may be present within the channel portion 218, for example to set a threshold voltage Vt, or to provide HALO pocket implants, etc. Even for impurity-doped embodiments however, impurity dopant level within the channel portion 218 is relatively low, for example below $10^{15}$ cm$^{-3}$, and advantageously below $10^{13}$ cm$^{-3}$. The sub-fin 216 is advantageously a III-V material having a significant band offset (e.g., conduction band offset for N-type devices) from the channel portion 218. Example materials, include, but are not limited to, GaAs, GaSb, GaAsSb, GaP, InAlAs, GaAsSb, AlAs, AlP, AlSb, and AlGaAs. In some N-type transistor embodiments where the channel portion 218 is InGaAs, the sub-fin 216 is GaAs, and may also be doped with impurities (e.g., P-type) to a greater impurity level than the channel portion 218. In an alternate heterojunction embodiment, the sub-fin 216 and the channel portion 218 are each group IV semiconductors (e.g., Si, Ge, or SiGe). The sub-fin 216 may be a first elemental semiconductor (e.g., Si or Ge) or a first SiGe alloy (e.g., having a wide bandgap). For example P-type transistor embodiments, the channel portion 218 is advantageously a group IV material having a high hole mobility, such as but not limited to Ge or a Ge-rich SiGe alloy. For some example embodiments, the channel portion 218 has a Ge content between 0.6 and 0.9, and advantageously is at least 0.7. In some embodiments with highest mobility, the channel portion 218 is intrinsic III-V (or IV for P-type devices) material and not intentionally doped with any electrically active impurity. In alternate embodiments, one or more a nominal impurity dopant level may be present within the channel portion 218, for example to set a threshold voltage Vt, or to provide HALO pocket implants, etc. Even for impurity-doped embodiments however, impurity dopant level within the channel portion 218 is relatively low, for example below $10^{15}$ cm$^{-3}$, and advantageously below $10^{13}$ cm$^{-3}$. The sub-fin 216 may advantageously be a group IV material having a significant band offset (e.g., valance band offset for P-type devices) from the fin. Example materials, include, but are not limited to, Si or Si-rich SiGe. In some P-type transistor embodiments, the sub-fin 216 is Si and may also be doped with impurities (e.g., N-type) to a higher impurity level than the channel portion 218.

The fin 202 may include a source region and a drain region on either side of the gate stack 210, thus realizing a transistor. As is well known in the art, source and drain regions are formed for the gate stack of each MOS transistor. As described above, the source and drain regions of a transistor are interchangeable, and a nomenclature of a first terminal and a second terminal of an access transistor terminal pair has been introduced for use in the present disclosure. In FIG. 2, reference numeral 220 is used to label the first terminal and reference numeral 222 is used to label the second terminal of each terminal transistor pair of source/drain terminals as described herein. Thus, for the access transistor 110, the source/drain terminal, or region, 220 is the source or the drain terminal/region that is coupled to the BL 140, while 222 is the other one of the source/drain terminal of the access transistor 110, coupled to the ferroelectric capacitor 120.

The source and drain regions of the transistor 110 may generally be formed using either an implantation/diffusion process or an etching/deposition process. In the former process, dopants such as boron, aluminum, antimony, phosphorous, or arsenic may be ion-implanted into the channel material to form the source and drain regions. An annealing process that activates the dopants and causes them to diffuse further into the channel material 206 typically follows the ion implantation process. In the latter process, the channel material 206 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

In some embodiments, the access transistor 110 may have a gate length (i.e., a distance between the terminals 220 and 222 of the transistor terminal pair of the access transistor 110), a dimension measured along the fin 202, in the direction of the x-axis of an example reference coordinate system x-y-z shown in FIG. 2, between about 20 and 40 nanometers, including all values and ranges therein (e.g., between about 22 and 35 nanometers, or between about 20 and 30 nanometers). In some embodiments, the fin 202 may have a thickness, a dimension measured in the direction of the y-axis of the reference coordinate system x-y-z shown in FIG. 2, between about 5 and 30 nanometers, including all values and ranges therein (e.g., between about 7 and 20 nanometers, or between about 10 and 15 nanometers). In some embodiments, the fin 202 may have a height, a dimension measured in the direction of the z-axis of the reference coordinate system x-y-z shown in FIG. 2, between about 30 and 350 nanometers, including all values and ranges therein (e.g., between about 30 and 200 nanometers, between about 75 and 250 nanometers, or between about 150 and 300 nanometers).

Although the fin 202 illustrated in FIG. 2 is shown as having a rectangular cross-section in a z-y plane of the reference coordinate system shown in FIG. 2, the fin 202 may instead have a cross-section that is rounded or sloped at the "top" of the fin 202 (e.g., as shown in the example illustration of FIG. 4), and the gate stack 210 may conform to this rounded or sloped fin 202. In use, the FinFET access transistor 110 may form conducting channels on as many as three "sides" of the fin 202, potentially improving performance relative to single-gate transistors (which may form conducting channels on, at most, one "side" of a channel material) and double-gate transistors (which may form conducting channels on, at most, two "sides" of a channel material).

As shown in FIG. 2, the second S/D terminal, or region, 222 of the access transistor 110 is coupled to the ferroelectric capacitor 120. In some embodiments, the ferroelectric capacitor 120 may be a non-planar (i.e., three-dimensional) capacitor, as shown in the particular example of FIG. 2 with the capacitor 120 being illustrated as a cylinder. The inset 224 of FIG. 2 illustrates the individual electrodes 226, 228, and the ferroelectric material 230 of the ferroelectric capacitor 120 for this embodiment of a cylindrical capacitor 120. In the embodiments where the ferroelectric capacitor 120 is such a cylindrical capacitor, the first capacitor electrode 226 of the ferroelectric capacitor 120 may be implemented as a wire (i.e., an elongated element) having sides encompassed by the second capacitor electrode 228 of the ferroelectric capacitor 120 (i.e., the first capacitor electrode 226 may be surrounded by the second capacitor electrode 228 along the length of the wire), and the second capacitor electrode 228 is shaped substantially as a hollow cylinder. In other embodiments (not specifically shown in the figures), the ferroelectric capacitor 120 may be a rectangular prism capacitor in which, again, the first capacitor electrode 226 comprises a wire (i.e., an elongated element) having sides encompassed by the second capacitor electrode 228 (i.e., the first capacitor electrode is surrounded by the second capacitor electrode along the length of the wire), but now the second capacitor electrode 228 may be shaped substantially as a hollow rectangular prism. In various embodiments, the substantially cylindrical and rectangular prism shapes of the ferroelectric capacitor 120 may include further modifications, e.g., the rectangular prism may have rounded corners. In general, a shape of a cross-section of the second electrode 228 of the ferroelectric capacitor 120 may conform to a shape of a cross-section of the first electrode 226 of the ferroelectric capacitor 120.

As shown in the inset 224 of FIG. 2, the ferroelectric capacitor 120 further includes a ferroelectric material 230 provided between its first and second electrodes 226, 228 (the ferroelectric material 230 shown in the inset 224 of FIG. 2 as a thick black line between the capacitor electrodes 226, 228), which is what makes the capacitor 120 a ferroelectric capacitor. While FIGS presented herein provide example illustrations of embodiments where the ferroelectric material 230 replaces a dielectric material provided between the two electrodes of a conventional capacitor, in other embodiments, such a material may be provided in addition to the conventional dielectric of a capacitor, all of which embodiments being within the scope of the present disclosure.

The ferroelectric material 230 may include one or more materials which exhibit sufficient ferroelectric behavior even at thin dimensions as typically used in scaled logic transistors as the ones illustrated here. Some examples of such materials known at the moment include hafnium zirconium oxide (HfZrO, also referred to as HZO), silicon-doped (Si-doped) hafnium oxide, germanium-doped (Ge-doped) hafnium oxide, aluminum-doped (Al-doped) hafnium oxide, and yttrium-doped (Y-doped) hafnium oxide. However, in other embodiments, any other materials which exhibit ferroelectric behavior at thin dimensions may be used as the material 230 and are within the scope of the present disclosure. The ferroelectric material 230 may have a thickness that may, in some embodiments, be between about 0.5 nanometers and 10 nanometers, including all values and ranges therein (e.g., between about 1 and 8 nanometers, or between about 0.5 and 5 nanometers).

Even though not specifically shown in FIGS. of the present disclosure, in some embodiments, the access transistor 110 may also be a ferroelectric device, i.e., it may have the ferroelectric material layer such as the ferroelectric material 230 described herein. In some embodiments, such a ferroelectric material may be included in the gate stack 210 of the access transistor 110.

Below, two different diagonal arrangements in which a plurality of 1T-1FE-CAP memory cells 100 may be arranged to form a memory array are described, followed by example READ and WRITE operations for such memory cells.

1T-1FE-CAP Memory Cells in a First Diagonal Arrangement: Diagonal BLs

Figure 3:
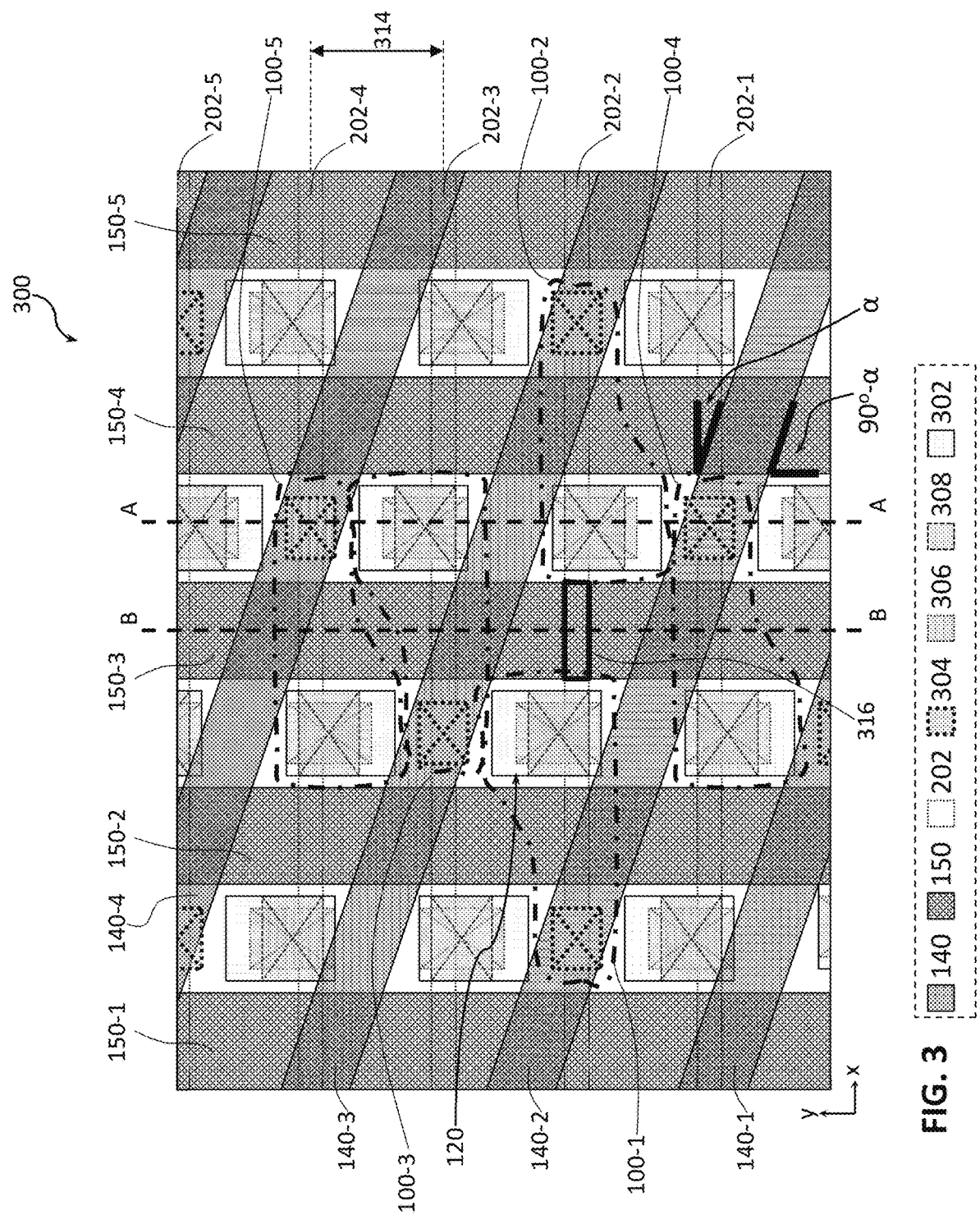
FIG. 3 is a top down view of an example memory array of 1T-1FE-CAP memory cells with diagonal BLs, according to some embodiments of the present disclosure.
Figure 4:
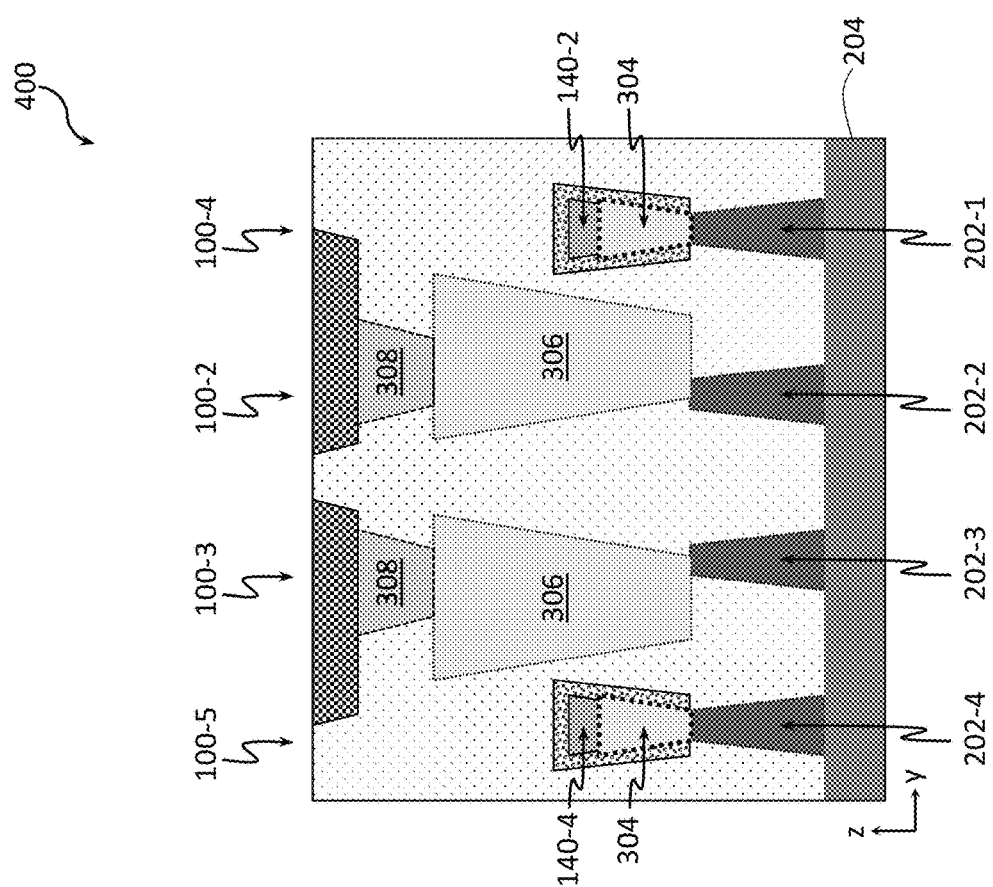
FIG. 4 is a cross-sectional side view along a portion of a plane AA of the example arrangement shown in FIG. 3, according to some embodiments of the present disclosure.
Figure 5:
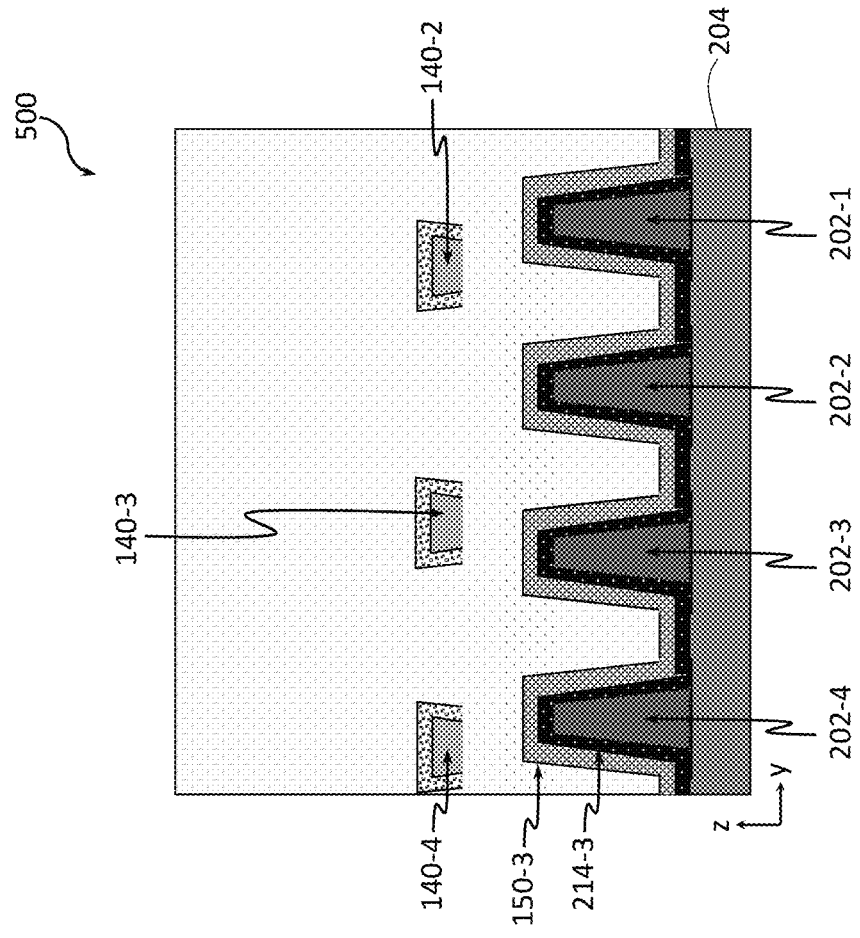
FIG. 5 is a cross-sectional side view along a portion of a plane BB of the example arrangement shown in FIG. 3, according to some embodiments of the present disclosure.

FIG. 3 is a top down (x-y plane) view of an example memory array 300 of the 1T-1FE-CAP memory cells 100 with diagonal BLs 140, while FIGS. 4 and 5 are cross-sectional side (y-z) views along, respectively, a portion of a plane AA and a portion of a plane BB of the example arrangement shown in FIG. 3, according to some embodiments of the present disclosure. Although specific numbers of elements are shown in FIGS. 3-5, e.g., a specific number of BLs, a specific number of WLs, a specific number of ferroelectric capacitors, etc., the memory array 200 may include any other suitable numbers of two or more of such elements. In FIGS. 3-5, elements labeled with reference numerals used in FIGS. 1-2 are intended to represent the same or analogous elements as those shown in FIGS. 1-2. Different instances of the same type of element are labeled with a reference numeral after a dash, e.g., a first instance of the BL 140 is shown as a BL 140-1, a second instance of the BL 140 is shown as a BL 140-2, and so on. In order to not clutter the drawings, not all individual instances of all elements are specifically labeled in FIGS. 3-5. Furthermore, some elements are distinguished in FIGS. 3-5 by being shown with a different pattern and are not specifically labeled with a reference numeral referred to in the text, with the correspondence between different reference numerals referred to in the present description and patterns shown in the drawings provided within a dashed box at the bottom of the drawings. In addition, while FIG. 3 is intended to illustrate a top down view, some of the elements provided in a plane below the view, which would normally be obscured by other elements in such a view, e.g., fins 202, are still shown, although outlined with dotted lines. The z-height relationship of various elements of the memory array 300 becomes clear from the cross-sectional side views of FIGS. 3-4 and descriptions provided herein.

As shown in FIG. 3, the memory array 300 may include a plurality of BLs 140 and a plurality of WLs 150, coupled to respective terminals of different 1T-1FE-CAP memory cells 100. The memory array 300 may further include a plurality of PLs 160, although such PLs are not individually shown in FIG. 3, and, instead only individual instances of a PL landing pad 302 (which may connect to the ferroelectric capacitor 120) is shown, which is a landing pad for coupling a respective PL 160 to the first capacitor electrode 226 of a respective 1T-1FE-CAP memory cell 100, e.g., by means of V0. Each one of the 1T-1FE-CAP memory cells 100 of the memory array 300 is connected to and can be selected for READ and WRITE operations by a unique combination of a particular BL 140, a particular WL 150, and a particular PL 160.

Five example memory cells 100, memory cells 100-1, 100-2, 100-3, 100-4, and 100-5, are specifically indicated in FIG. 3 by having their contours, loosely, shown with dashed-dotted lines. Thus, different elements of these memory cells described below refer to instances of those elements within the respective dashed-dotted contour of each respective cell, e.g. a BL contact 304 of the first memory cell 100-1 refers to the BL contact 304 shown within the contour indicated in FIG. 2 for the first memory cell 100-1, etc. Each of the memory cells shown in FIG. 3 is a different instance of the memory cell 100 as shown in FIG. 1, where the access transistor 110 may be implemented as shown in FIG. 2, described above. For the memory cell 100-1 of the memory array 300, the FinFET 110 includes a fin 202-2 with a WL 150-2 being coupled to, or forming, a gate electrode 212 of the FinFET 110, and a BL 140-2 being coupled to a first S/D terminal 220 of the FinFET 110 of the memory cell 100-1 by virtue of the first S/D terminal 220 being coupled to a BL contact 304 (i.e., the BL contact 304 of the memory cell 100-1 provides electrical coupling between the first S/D terminal 220 of the memory cell 100-1 and the BL 140-2), the BL contacts 304 schematically illustrated in FIG. 3 as dotted-line envelopes. Furthermore, for the memory cell 100-1, the ferroelectric capacitor 120 is coupled to a second S/D terminal of the FinFET 110 by having the second capacitor electrode 228 coupled to the second S/D terminal 222 of the fin 202-2 (via a cell contact 306; i.e., a cell contact 306 of the memory cell 100-1 provides electrical coupling between the second S/D terminal 222 of the memory cell 100-1 and the second capacitor electrode 228). Still further, for the memory cell 100-1, a via structure V0 308 is a structure for electrically coupling the PL (i.e., M1 landing pad shown in FIG. 4) to first capacitor electrode 226 (i.e., the inside electrode of the ferroelectric capacitor 120). In other embodiments, details of how a ferroelectric capacitor 120 is coupled to the second S/D terminal 222 of the FinFET 110 may be different than what is shown in FIG. 3. However, discussions provided with respect to the diagonal arrangement are still applicable to all such embodiments. Therefore, in general, the landing pad 302, the cell contact 306, and the via structure V0 shown in FIG. 3 may be replaced with a schematic illustration of a ferroelectric capacitor 120 at that location.

As shown in FIG. 3, other memory cells shown include analogous elements as those described for the memory cell 100-1. Therefore, in the interests of brevity, their individual descriptions are not repeated here.

As can be seen from the top view of FIG. 3, what makes the memory array 300 a "diagonal" arrangement is that, in a two-dimensional (2D) design layout view, the BLs 140 are not perpendicular to the WLs 150 and the fins 202. Instead, in this embodiment of the diagonal memory array 300, the BLs 140 are at a diagonal angle with respect to the fins 202. Since the fins 202 are perpendicular to the WLs 150, the BLs 140 are also at a diagonal angle with respect to the WLs 150. Namely, if an angle between the BLs 140 and the fins 202 is $\alpha$, then an angle between the BLs 140 and the WLs 150 is $90°-\alpha$, these angles illustrated at the bottom right corner of the view of FIG. 3 for two example pairs of 1) BL and fin, and 2) BL and WL (respective portions of BL, fin, and WL shown in the bottom right corner of FIG. 3 with thick black lines). Since the BLs 140, the fins 202, and the WLs 150 are not necessarily in the same plane above the substrate (i.e., not at the same z-height), e.g., both the WLs 150 and the BLs 140 may be above the fin 202, this angle may be expressed as an angle between projections of said elements onto a single plane parallel to the substrate. Thus, for the embodiment of the diagonal memory array 300, a projection of any BL 140 onto a plane parallel to the substrate is at a diagonal angle $\alpha$, e.g., at an angle between about 5 and 45 degrees or at an angle between about 10 and 30 degrees, with respect to a projection of any fin 202 onto said plane, and at an angle $90°-\alpha$ with respect to a projection of any WL 150 onto the same plane. This is in contrast with memory array implementations where typically BLs are parallel to the fins. Providing such diagonal BLs may allow increasing density of 1T-1FE-CAP memory cells in an array and may allow to relax the requirement on the pitch between neighboring fins 202 (i.e., center-to-center distance between the fins 202 which are direct neighbors to one another may be decreased). In some embodiments, using the diagonal arrangement of the memory array 300 may allow achieving approximately 30-45% smaller cell area compared with similar non-diagonal (e.g., the parallel fin and BL cell layout), while using a looser fin pitch ("fin pitch" is shown as distance 314 in FIG. 3), which, in turn, advantageously relaxes the requirements imposed on the lithography and design rules.

What is also unique about the diagonal memory array 300 of FIG. 3, is that, by virtue of using ferroelectric capacitors 120, two neighboring capacitors 120 on a single fin, e.g. the capacitor 120 of the memory cell 100-1 and the capacitor 120 of the memory cell 100-2, both provided along the fin 202-2, do not have to be isolated from one another by interrupting (e.g., cutting) the fin 202-2 between them (a portion shown in FIG. 3 as a portion 316 highlighted with a thick black line outlining said portion of the fin 202-2), as would need to be done if an analogous DRAM array with 1T-1CAP memory cells using non-ferroelectric capacitors was to be implemented with diagonal BLs. In other words, in the memory array 300, a fin between two adjacent ferroelectric capacitors belonging to different memory cells (e.g., the portion 316) may be continuous. This advantageously eliminates the need for an additional fabrication step of cutting the fin between adjacent capacitors belonging to different memory cells implemented along a single fin. It should be noted that, as shown in FIG. 3, one of the WLs may cross the portion 316, namely the WL 150-3 crosses the portion 316, thus forming a gate over the portion 316 of the fin 202-2. However, this is not an active gate of the two memory cells in question—namely, of the memory cells 100-1 and 100-2 provided along that fin with the portion 316 being between the ferroelectric capacitors 120 of those memory cells. Therefore, when the memory cells 100-1 or 100-2 are addresses for READ or WRITE operations and their gates may need to be turned on, the gate formed by the WL 150-3 over the portion 316 is not turned on (i.e., remains off) and may, therefore, be referred to as a "dummy gate"—i.e., a structure that may look like a gate but does not serve/function as an active gate of a transistor. The WL 150-3 does serve as a real, i.e., not dummy, gate for other memory cells, e.g., for the memory cell s 100-3 and 100-5 shown in FIG. 3 above the portion 316 and for the memory cell 100-4 shown in FIG. 3 below the portion 316 (each of which memory cells is provided over a respective different fin 202—namely, fins 202-3, 202-4, and 202-1, respectively).

FIGS. 4 and 5 provide cross-sectional illustrations 400 and 500, respectively, of portions of the memory array 300 along the lines AA and BB, respectively. These FIGS. illustrate further details of the memory array 300. Both FIGS. 4 and 5 illustrate fins 202-1, 202-2, 202-3, and 202-4, extending away from the base 204, as described above. FIGS. 4 and 5 also illustrate respective BLs shown in the sections AA and BB of FIG. 3 within a region between the fins 202-1 and 202-4. Since the cross-section of FIG. 4 is through the region with the BL contacts and capacitors, these elements are shown in FIG. 4. In particular, FIG. 4 illustrates the BL contact 304 of the memory cell 100-5 provided over the fin 202-4 (namely, provided over the first S/D terminal 220 of the access transistor 110 of the memory cell 100-5), and the BL contact 304 of the memory cell 100-4 provided over the fin 202-1 (namely, provided over the first S/D terminal 220 of the access transistor 110 of the memory cell 100-4). FIG. 4 further illustrates the cell contact 306, the V0 308, and the M1 landing pad 302 provided over the fin 202-3 (namely, provided over the second S/D terminal 220 of the access transistor 110 of the memory cell 100-3), and the cell contact 306, the V0 308, and the M1 landing pad 302 provided over the fin 202-3 (namely, provided over the second S/D terminal 220 of the access transistor 110 of the memory cell 100-2). Since the cross-section of FIG. 5 is through the region without the BL contacts and capacitors, these elements are not shown in FIG. 5. The portions of the corresponding BLs 140, however, are shown in FIG. 5—namely, the BLs 140-4, 140-3, and 140-2. Also shown in FIG. 5 is the WL 150-3, which may simultaneously serve as the gate electrode 212, extending over multiple fins 202 parallel to one another, with the gate dielectric 214-3 ("-3" because it corresponds to the WL 150-3) provided between the WL 150-3 and the fins 202 as a part of the gate stacks 210 provided over the fins. While the gate dielectric 214-3 is shown to be continuous over multiple fins 202 and in between the fins, in other embodiments it does not have to be so, as long as the gate dielectric 214-3 is provided over those fins where the WL 150-3 is supposed to serve as the gate electrode of the access transistor 110.

Further shown in FIGS. 4 and 5 is an insulating material 404 provided over various portions of the memory array 300. In some embodiments, the insulating material 404 may include any suitable dielectric material typically used as an insulating medium, e.g., may include any suitable interlayer dielectric (ILD) materials such as silicon oxide, silicon nitride, aluminum oxide, and/or silicon oxynitride.

Still further, FIGS. 4 and 5 illustrate an etch stop material 406 provided over at least portions of the BLs 140. A layer of the etch stop material 406 may serve to prevent or minimize etching into the BLs 140 during fabrication of the cell contacts 306, in particular, when openings in the insulating material 404 may be formed for forming the cell contacts 306, as well as, optionally, to prevent or minimize etching into the BLs 140 during fabrication of any other components associated with an IC that includes the memory array 300. In some embodiments, the etch stop material 406 may include any material that has sufficient etch selectivity with respect to the insulating material 404. As known in the art, two materials are said to have "sufficient etch selectivity" when etchants used to etch one material do not substantially etch the other, enabling selective etching of one material but not the other. In some embodiments, the etch stop material 406 may include a dielectric material, as long as the dielectric material of the etch stop material 406 is different from that of the insulating material 404. For example, in some embodiments, the etch stop material 406 may include silicon nitride (i.e., a material that includes silicon and nitrogen) or tantalum nitride (i.e., a material that includes tantalum and nitrogen).

1T-1FE-CAP Memory Cells in a Second Diagonal Arrangement: Diagonal Fins

Figure 6:
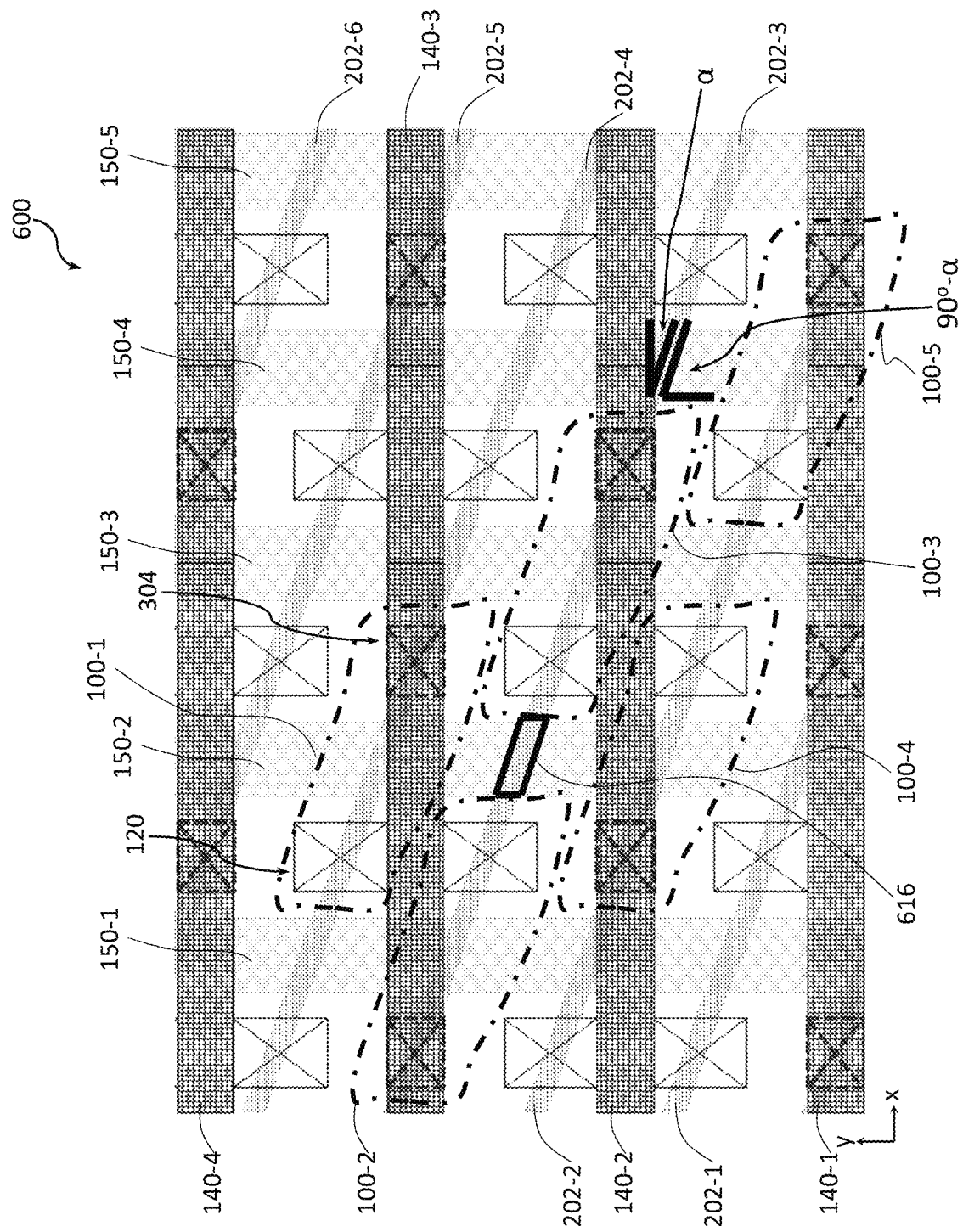
FIG. 6 is a top down view of an example memory array of 1T-1FE-CAP memory cells with diagonal fins, according to some embodiments of the present disclosure.

FIG. 6 is a top down (x-y plane) view of an example memory array 600 of the 1T-1FE-CAP memory cells 100 with diagonal fins 202. The top view of FIG. 6 is similar to that of FIG. 3, therefore, discussions regarding what is shown and what is not shown, of what is labeled and what is not labeled, provided above for FIG. 3 are applicable to FIG. 6 and, in the interests of brevity, are not repeated.

Similar to the memory array 300, the memory array 600 may include a plurality of BLs 140 coupled to first S/D terminals 220 of the FinFETs 110 of respective memory cells 100 via respective BL contacts 304, a plurality of ferroelectric capacitors 120 coupled to second S/D terminals 222 of the FinFETs 110 of respective memory cells 100 (capacitor PLs 160 are not specifically shown in FIG. 6), and a plurality of WLs 150 coupled to the gate terminals 212 of the FinFETs 110 of respective memory cells 100. Each one of the 1T-1FE-CAP memory cells 100 of the memory array 600 is connected to and can be selected for READ and WRITE operations by a unique combination of a particular BL 140, a particular WL 150, and a particular PL 160.

Five example memory cells 100, memory cells 100-1, 100-2, 100-3, 100-4, and 100-5, are specifically indicated in FIG. 6 by having their contours, loosely, shown with dashed-dotted lines, where, similar to FIG. 3, different elements of these memory cells described below refer to instances of those elements within the respective dashed-dotted contour of each respective cell. Each of the memory cells shown in FIG. 6 is a different instance of the memory cell 100 as shown in FIG. 1, where the access transistor 110 may be implemented as shown in FIG. 2 and the ferroelectric capacitor 120 may be implemented as a 3D capacitor, both described above. For the memory cell 100-1 of the memory array 600, the FinFET 110 includes a fin 202-4 with a WL 150-2 being coupled to, or forming, a gate electrode 212 of the FinFET 110, and a BL 140-3 being coupled to the first S/D terminal 220 of the FinFET 110 of the memory cell 100-1 by virtue of the first S/D terminal 220 being coupled to a BL contact 304 (i.e., in the memory array 600, the BL contact 304 of the memory cell 100-1 provides electrical coupling between the first S/D terminal 220 of the memory cell 100-1 and the BL 140-3), the BL contacts 304 schematically illustrated in FIG. 6 as dashed-line envelopes. Furthermore, for the memory cell 100-1, the ferroelectric capacitor 120 (such capacitors schematically illustrated in FIG. 6 as solid-line envelopes) is coupled to the second S/D terminal of the FinFET 110, e.g., by having the second capacitor electrode 228 coupled to the second S/D terminal 222 of the fin 202-4. For the memory cell 100-2 of the memory array 600, the FinFET 110 includes a fin 202-3 with a WL 150-1 being coupled to, or forming, a gate electrode 212 of the FinFET 110, and a BL 140-3 being coupled to the first S/D terminal 220 of the FinFET 110 of the memory cell 100-1 by virtue of the first S/D terminal 220 being coupled to the BL contact 304 of the memory cell 100-2. Furthermore, for the memory cell 100-2, the ferroelectric capacitor 120 is coupled to the second S/D terminal 222 of the FinFET 110, e.g., by having the second capacitor electrode 228 coupled to the second S/D terminal 222 of the fin 202-3. For the memory cell 100-3 of the memory array 600, the FinFET 110 again includes the fin 202-3, but now with a WL 150-3 being coupled to, or forming, the gate electrode 212 of the FinFET 110, and a BL 140-2 being coupled to the first S/D terminal 220 of the FinFET 110 of the memory cell 100-1 by virtue of the first S/D terminal 220 being coupled to the BL contact 304 of the memory cell 100-2. Furthermore, for the memory cell 100-3, the ferroelectric capacitor 120 is coupled to the second S/D terminal 222 of the FinFET 110, e.g., by having the second capacitor electrode 228 coupled to the second S/D terminal 222 of the fin 202-3.

As shown in FIG. 6, other memory cells shown include analogous elements as those described for the memory cells 100-1, 100-2, and 100-3. Therefore, in the interests of brevity, their individual descriptions are not repeated here.

As can be seen from the top view of FIG. 6, what makes the memory array 600 a "diagonal" arrangement is that, in a 2D design layout view, the fins 202 are not perpendicular to the BLs 140 and the WLs 150. Instead, in this embodiment of the diagonal memory array 300, the fins 202 are at a diagonal angle with respect to the BLs 140. Since the BLs 140 are perpendicular to the WLs 150, the fins 202 are also at a diagonal angle with respect to the WLs 150. Namely, if an angle between the fins 202 and the BLs 140 is $\alpha$, then an angle between the fins 202 and the WLs 150 is $90°-\alpha$, these angles illustrated at the bottom right corner of the view of FIG. 6 for two example pairs of 1) fin and BL, and 2) fin and WL (respective portions of BL, fin, and WL shown in the bottom right corner of FIG. 6 with thick black lines). Since the BLs 140, the fins 202, and the WLs 150 are not necessarily in the same plane above the substrate (i.e., not at the same z-height), e.g., both the WLs 150 and the BLs 140 may be above the fin 202, this angle may be expressed as an angle between projections of said elements onto a single plane parallel to the substrate. Thus, for the embodiment of the diagonal memory array 600, a projection of any fin 202 onto a plane parallel to the substrate is at a diagonal angle $\alpha$, e.g., at an angle between about 5 and 45 degrees or at an angle between about 10 and 30 degrees, with respect to a projection of any BL 140 onto said plane, and at an angle $90°-\alpha$ with respect to a projection of any WL 150 onto the same plane. This is in contrast with ferroelectric memory array implementations where typically BLs are parallel to the fins. Providing such diagonal fins may allow increasing density of 1T-1FE-CAP memory cells in an array and may allow to relax the requirement on the pitch between neighboring elements of the memory array.

What is also unique about the diagonal memory array 600 of FIG. 6, is that, by virtue of using ferroelectric capacitors 120, two neighboring capacitors 120 on a single fin, e.g. the capacitor 120 of the memory cell 100-2 and the capacitor 120 of the memory cell 100-3, both provided along the fin 202-3, do not have to be isolated from one another by interrupting (e.g., cutting) the fin 202-3 between them (a portion shown in FIG. 6 as a portion 616 highlighted with a thick black line outlining said portion of the fin 202-3), as would need to be done if an analogous DRAM array with 1T-1CAP memory cells using non-ferroelectric capacitors was to be implemented with diagonal fins. In other words, in the memory array 600, a fin between two adjacent ferroelectric capacitors belonging to different memory cells (e.g., the portion 616) may be continuous. This advantageously eliminates the need for an additional fabrication step of cutting the fin between adjacent capacitors belonging to different memory cells implemented along a single fin. It should be noted that, as shown in FIG. 6, one of the WLs may cross the portion 616, namely—the WL 150-2 crosses the portion 616, thus forming a gate over the portion 616 of the fin 202-3. However, this is not an active gate of the two memory cells in question—namely, of the memory cells 100-2 and 100-3 provided along that fin with the portion 616 being between the ferroelectric capacitors 120 of those memory cells. Therefore, when the memory cells 100-2 or 100-3 are addresses for READ or WRITE operations and their gates may need to be turned on, the gate formed by the WL 150-2 over the portion 616 is not turned on (i.e., remains off) and may, therefore, be referred to as a "dummy gate"—i.e., a structure that may look like a gate but does not serve/function as an active gate of a transistor. The WL 150-2 does serve as a real, i.e., not dummy, gate for other memory cells, e.g., for the memory cell 100-1 shown in FIG. 6 above the portion 616 and for the memory cell 100-4 shown in FIG. 6 below the portion 616 (each of which memory cells is provided over a respective different fin 202—namely, fins 202-4 and 202-2, respectively).

Alternative Example 1T-1FE-CAP Memory Cell

While discussions and illustrations above refer to the access transistor 110 as the FinFET, embodiments of the present disclosure further include variations of the above descriptions where the access transistor 110 would be implemented with an architecture different from FinFET. For example, in some embodiments, the access transistor 110 may be implemented as an all-around-gate transistor, also sometimes referred to as a "wire transistor." In such embodiments, instead of the fin 202 extending away from the base in the arrangement shown, e.g., in FIG. 2, the access transistor 110 would include a wire provided above the base (e.g., substrate) 202. Thus, in the all-around-gate transistor, a wire formed of a semiconductor channel material 206 (or a combination of semiconductor materials) may extend above the base 202. In various embodiments, such a wire may take the form of a nanowire or nanoribbon, for example. The gate stack 210 may wrap entirely or almost entirely around the wire, with the channel material 206 corresponding to the portion of the wire wrapped by the gate stack 210. In particular, the gate dielectric 214 may wrap around the channel material 206 of the wire, and the gate electrode material 212 may wrap around the gate dielectric 214. The wire would then include source/drain regions/terminals 220 and 222 on either side of the gate stack 210, similar to FinFET, thus realizing a transistor. In some embodiments, such a wire may have a rectangular cross-section, while, in other embodiments, the wire may instead have a cross-section that is rounded or otherwise irregularly shaped, and the gate stack 210 may conform to the shape of the wire. In use, an all-around-gate transistor may form conducting channels on more than three "sides" of the wire and may have better electrostatics (enabling a shorter transistor channel length), thus, potentially improving performance relative to FinFETs.

Discussions of diagonal arrangements provided above with reference to the fins 202 may then be repeated by replacing the fin 202 with the "wire" of an all-around gate access transistor 110, all of which embodiments being, therefore, within the scope of the present disclosure.

Figure 8:
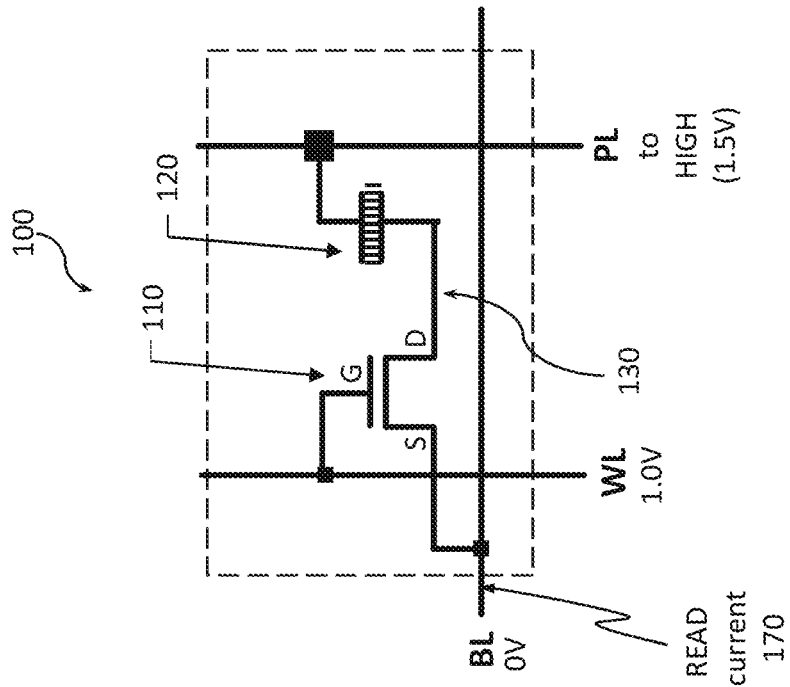
FIG. 8 is a schematic illustration of a 1T-1FE-CAP memory cell with an indication of READ current, according to some embodiments of the present disclosure.
Figure 7:
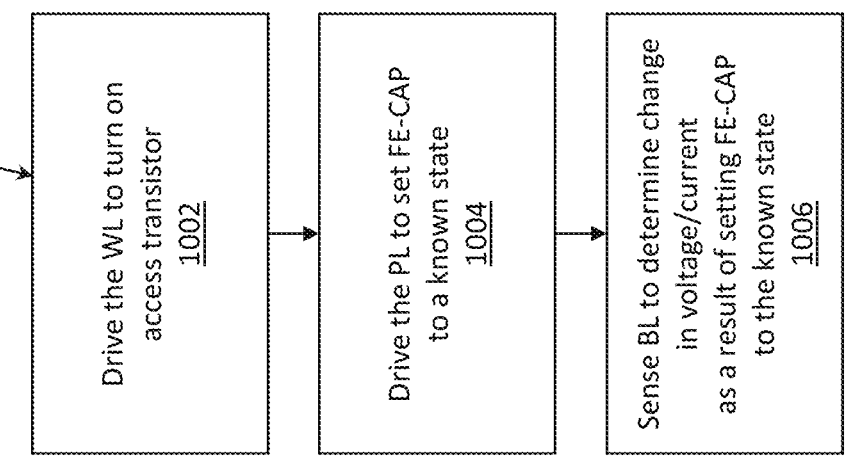
FIG. 7 is a flow diagram of an example method for reading a 1T-1FE-CAP memory cell, in accordance with various embodiments.

READ and WRITE Operations for a 1T-1FE-CAP Memory Cell in a Diagonal Arrangement Next, methods of operating the 1T-1FE-CAP memory cell as described herein will be explained, with reference to associated FIGS. In particular, FIGS. 7 and 8 illustrate a READ operation, while FIGS. 9-12 illustrate a WRITE operation.

FIG. 7 is a flow diagram of an example method 1000 for reading a 1T-1FE-CAP memory cell, in accordance with various embodiments.

At 1002 shown in FIG. 7, the WL 150 is asserted (e.g., the WL 150 transitions from logic low to logic high to turn on the access transistor 110), e.g., by applying voltage sufficient to turn on the transistor 110, e.g., 1.0 Volts (V) as illustrated in FIG. 8. Once the access transistor 110 is switched on, current can flow through it, between the first terminal 220 and the second terminal 222 of the access transistor terminal pair as defined herein. Because the ferroelectric capacitor 120 is connected in series with the access transistor 110, if current flows through the access transistor 110, then current also flows through the ferroelectric capacitor 120. Furthermore, the current flowing through this series of the access transistor 110 and the ferroelectric capacitor 120 is modulated (i.e., affected/changed) by the polarization state of the ferroelectric material 230 in the ferroelectric capacitor 120. As described above, the first terminal of the transistor terminal pair of the access transistor 110 is coupled to the BL 140, and the second terminal of the transistor 110 is coupled to the second capacitor electrode 228 of the ferroelectric capacitor 120. Therefore, the current through this series of the access transistor 110 and the ferroelectric capacitor 120 flows through the BL 140, as is schematically illustrated in FIG. 8 with a READ current 170 in the BL 140.

At 1004 shown in FIG. 7, the PL 160 is asserted to ensure that the polarization of the ferroelectric material 230 in the capacitor 120 is at a certain known state, e.g., polarization that corresponds to the logic state of "1" ("HIGH"), and a sense amplifier coupled to the BL 140 senses, at 1006, whether that action causes a change in the current or voltage on the BL 140. In order to ensure that the polarization of the ferroelectric material 230 in the capacitor 120 is at a certain known state, an electric field of suitable magnitude and direction may be applied across the ferroelectric material 230, which may be done by applying voltage of sufficiently high magnitude and a predefined polarity on the PL 160 at 1004, for a time period that is equal to or greater than a minimum transition duration (e.g., 100 nanoseconds (ns)).

The term "minimum transition duration" here generally refers to a suitable duration of time during which a voltage (e.g., due to the voltage on the PL 160, possibly in combination with the charge on the intermediate node 130) is applied to the ferroelectric material 230 to cause the ferroelectric material to be polarized and to store a charge according to the applied voltage. The minimum transition duration may be a predetermined value depending on the materials used in the ferroelectric material stack 230 and their thicknesses. In some embodiments, the minimum transition duration may be about 100 ns, however, this parameter should not be understood to be limiting, as the minimum transition duration could be designed to be substantially shorter or longer based upon application-specific requirements. In general, longer minimum transition times can enable lower voltage operation, higher read signals, longer ferroelectric retention.

FIG. 8 shows the initial states of the potentials right before the READ operation. Here the potential of the BL 140 may be set to an initial value, such as 0 V, and then floated (i.e., disconnected from a voltage source). The sense amplifier is coupled to the BL 140 and is configured to sense the voltage on the BL 140 and convert the magnitude of the sensed voltage to a digital logic value. Because the voltage in the BL 140 depends on the polarization state of the ferroelectric capacitor 120, sensing this voltage allows deducing the polarization state of the ferroelectric capacitor 120. If, prior to asserting the PL 160 at 1004 to switch the polarization of the ferroelectric material 230 in the ferroelectric capacitor 120 to the known state, the ferroelectric material 230 was already in that state, then there will be little change in voltage on the BL 140 as a result of performing the operation of 1004. However, if, prior to asserting the PL 160 at 1004, the ferroelectric material 230 was in a different logic state (i.e., the polarization of the material 230 was different), then, as a result of performing the operation of 1004, there will be noticeable change in voltage on the BL 140, as detected by the sense amplifier at 1006.

As the foregoing illustrates, similar to an eDRAM bit-cell, the 1T-1FE-Cap memory bit-cell 100 is read by sensing the voltage at the BL 140 through a sense amplifier. However, unlike an eDRAM bit-cell, logic state of the 1T-1FE-CAP memory cell may be stored in the ferroelectric capacitor 120 as a polarization of a ferroelectric, allows for longer retention times, compared to eDRAM.

Referring, again, to the example memory arrays 300 and 600 shown in FIGS. 3 and 6, during a READ operation, for unselected words in the array, the WL 150 remains de-asserted (e.g., the WL 150 remains or is transitioned from logic HIGH to logic LOW, e.g., 0V) and the access transistors of the array having gate terminals coupled to such WL 150 remain turned off. This may enable clear sensing of the selected memory cell by reducing the current through the unselected memory cells which may be connected to the same BL 140.

For example, during the READ of the memory cell 100-3 shown in FIG. 3, the WL 150-3 is asserted so that the access transistor 110 of the memory cell 100-3 turns on and a sense amplifier senses current or voltage on the BL 140-3 to determine the logic state of the memory cell 100-3. The memory cell 100-2 is connected to the same BL BL 140-3 and, therefore, could, in principle, affect the current or voltage on BL 140-3. However, because the WL 150-4 (i.e., the WL to which the memory cell 100-2 is coupled to) is de-asserted when the WL 150-3 is asserted to READ the memory cell 100-3, the access transistor 110 of the memory cell 100-2 is off and there is no current flowing through the series of the access and ferroelectric capacitor of the memory cell 100-2 and affecting the reading of the memory cell 100-3. As a result of asserting the WL 150-3 to read the memory cell 100-3, the access transistor 110 of the memory cell 100-5 also turns on, but since reading of the memory cell 100-3 is performed with a sense amplifier sensing current or voltage on the BL 140-3, change in voltage/current on the BL 140-4 (i.e., the BL to which the memory cell 100-5 is coupled to) would have no effect on reading the logic state of the memory cell 100-3. Similarly, as a result of asserting the WL 150-3 to read the memory cell 100-3, the access transistor 110 of the memory cell 100-4 also turns on, but since reading of the memory cell 100-3 is performed with a sense amplifier sensing current or voltage on the BL 140-3, change in voltage/current on the BL 140-2 (i.e., the BL to which the memory cell 100-4 is coupled to) would have no effect on reading the logic state of the memory cell 100-3. Analogous reasoning applies to the memory array 600 shown in FIG. 6.

Figure 9:
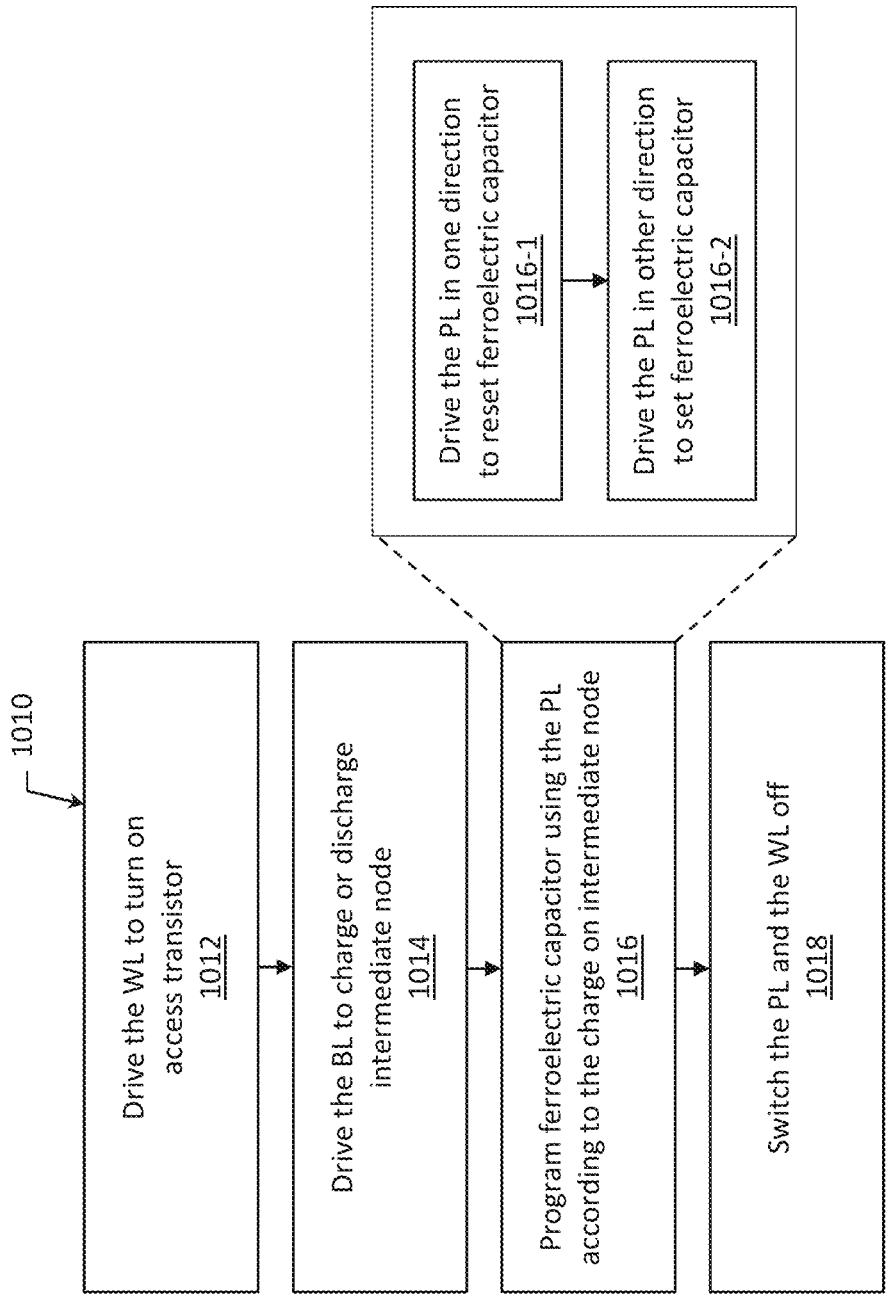
FIG. 9 is a flow diagram of an example method for programming a 1T-1FE-CAP memory cell, in accordance with various embodiments.

FIG. 9 is a flow diagram of an example method 1010 for programming, i.e., writing to, a 1T-1FE-CAP memory cell, in accordance with various embodiments.

At 1012 shown in FIG. 9, the WL 150 is asserted to turn on the access transistor 110, similar to the operation 1002 shown in FIG. 7 and described above. Again, once the access transistor 110 is switched on, current can flow through it, between the first terminal 220 and the second terminal 222 of the access transistor terminal pair, as defined herein.

At 1014 shown in FIG. 9, the BL 140 is asserted to charge or discharge the intermediate node 130, which may be helpful later in setting the desired polarization state of the ferroelectric material 230 in the memory cell 100.

For a WRITE operation, an electric field may be applied across the ferroelectric material 230 of the ferroelectric capacitor 120 in order to polarize the ferroelectric material 230 in a direction corresponding to the desired logic state. Such an electric field may be applied by changing the voltage on the PL 160. Therefore, at 1016 shown in FIG. 9, the ferroelectric capacitor 120 of the memory cell 100 is programmed using the PL 160 according to the charge on the intermediate node 130. In particular, the programming operation 1016 may be a two-phase operation illustrated as an inset in FIG. 9.

As shown in FIG. 9 with operation 1016-1, in the first phase, the PL 160 is driven in one direction (i.e., a first voltage of sufficiently high magnitude and a predefined polarity is applied on the PL 160), for more than a minimum transition duration (e.g., 100 ns), to reset, or clear, the ferroelectric capacitor 120. In other words, in the first phase, electric field is established, sufficient to polarize the ferroelectric material 230 to a particular known state (similar to the operation of 1004 shown in FIG. 7 for the READ operation of the memory cell 100), e.g., the one corresponding to logic state "0."

As such, depending on the electric field applied across the ferroelectric material 230, a logic state "1" or logic state "0" is stored as charge in the ferroelectric material when the voltage that establishes this electric field is applied for more or equal to the minimum transition duration. This charge can be substantially non-volatile (i.e., it decays over a very long period of time compared to the required storage/retention time). In some cases, non-volatility can be traded for lower voltage operation. For example, potentially the ferroelectric material could be designed to switch faster at a lower voltage but would also depolarize faster and provide shorter duration of non-volatility (e.g., 1 hour of non-volatile (NV) storage) before a refresh is needed.

In the second phase, following the first phase, shown in FIG. 9 with operation 1016-2, the PL 160 may be driven in the other direction (i.e., a second voltage of the opposite polarity than that applied at 1016-1 is applied on the PL 160) to set the ferroelectric capacitor 120 to the desired logic state by providing electric field, for the minimum transition duration, due to the combination of the voltage applied to the PL 160 and the charge on the intermediate node 130, that is sufficient to switch the polarization of the ferroelectric material 230 from the state set at 1016-1 to the desired state, e.g., the one corresponding to logic state "1."

At 1018, the PL 160 and the WL 150 may be switched off, i.e., de-asserted.

FIGS. 10-12 are flow diagrams of example methods 1020, 1030, and 1040 for programming a 1T-1FE-CAP memory cell, in accordance with various embodiments. These methods include analogous/same operations as those illustrated in the method 1010 shown in FIG. 9, as indicated by the same reference numerals of the operations as used in FIG. 9 except that one or both of the operations 1016 and 1018 of FIG. 9 may be divided, in FIGS. 10-12, into two separate operations, 1016 may be divided into 1016-1 and 1016-2 shown in FIGS. 10-12 and 1018 may be divided into 1018-1 and 1018-2 shown in FIGS. 10-12, which is intended to illustrate how the two-phase WRITE access described herein can be performed when individual operations are performed in different order. In particular, FIG. 10 illustrates that operations of the method 1010 may be performed in the following order: 1012, 1016-1, 1014, 1016-2, 1018-1, and 1018-2. On the other hand, FIG. 11 illustrates that operations of the method 1010 may be performed in the following order: 1016-1, 1016-2, 1012, 1014, 1018-2, and 1018-1. FIG. 12 illustrates that operations of the method 1010 may be performed in the following order: 1016-1, 1012, 1014, 1016-2, 1018-1, and 1018-2. Other modifications of the order of these steps in accordance with the principles described herein can be envisioned and are within the scope of the present disclosure.

Fabricating a 1T-1FE-CAP Memory Cell in a Diagonal Arrangement

Figure 13:
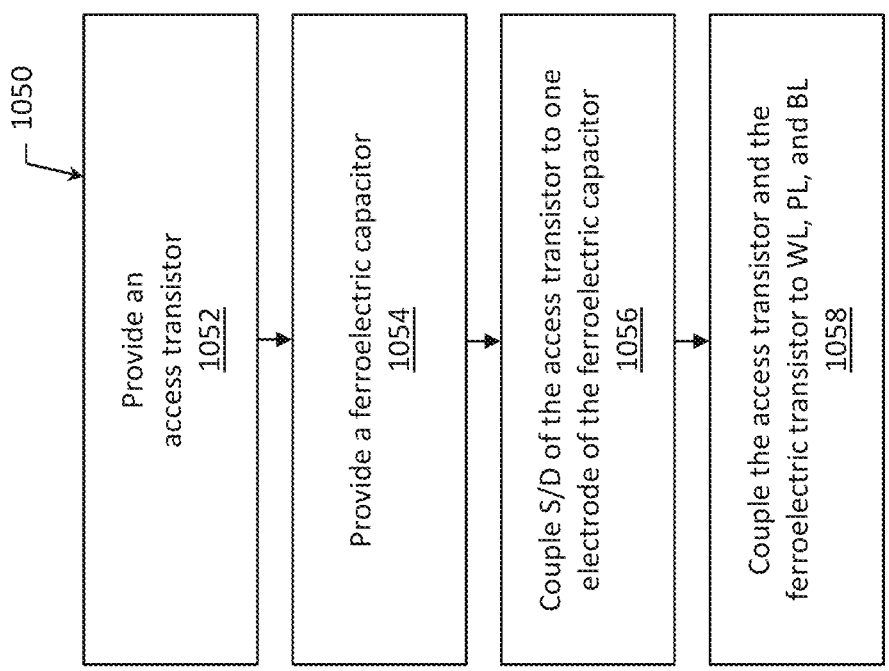
FIG. 13 is a flow diagram of an example method of manufacturing a 1T-1FE-CAP memory cell, in accordance with various embodiments.

The 1T-1FE-CAP memory cells 100 in any of the diagonal arrangements disclosed herein may be manufactured using any suitable techniques. For example, FIG. 13 is a flow diagram of an example method 1050 of manufacturing a 1T-1FE-CAP memory cell, in accordance with various embodiments. Although the operations of the method 1050 are illustrated once each and in a particular order, the operations may be performed in any suitable order and repeated as desired. For example, one or more operations may be performed in parallel e.g., to manufacture multiple 1T-1FE-CAP memory cells substantially simultaneously, or/and to manufacture the access transistors and the ferroelectric capacitors of the 1T-1FE-CAP memory cells substantially simultaneously. In another example, the operations may be performed in a different order to reflect the structure of a memory device in which the 1T-1FE-CAP memory cell will be included.

At 1052, an access transistor may be provided over a substrate. The access transistor may include a channel, and gate, source, and drain terminals which may take the form of any of the embodiments of the access transistor 110 disclosed herein (e.g., any of the embodiments discussed herein with reference to a FinFET or an all-around-gate access transistor). The channel material, gate electrode material, and source and drain regions of the access transistor may be provided at 1052 using any suitable deposition and patterning techniques known in the art, such as atomic layer deposition (ALD), chemical vapor deposition (CVD), physical vapor deposition (PVD) and various lithographic techniques such as photolithography or electron-beam lithography. In case a diagonal arrangement with diagonal fins is being implemented, the fin of the access transistor provided at 1052 is formed as to be diagonal with respect to the BL and the WL of the 1T-1FE-CAP memory cell. If the access transistor provided at 1052 is a ferroelectric transistor, then 1052 would also include providing the ferroelectric material, e.g., integrated with the gate stack of the transistor, using any suitable techniques known in the art.

At 1054, a ferroelectric capacitor may be provided over a substrate. The ferroelectric capacitor may include a ferroelectric material, or a stack of materials, provided between a pair of capacitor electrodes, and may take the form of any of the embodiments of the ferroelectric capacitor 120 disclosed herein (e.g., any of the embodiments discussed herein with reference to a three-dimensional ferroelectric capacitor). The ferroelectric material and the first and second electrodes of the ferroelectric capacitor may be provided at 1054 using any suitable deposition and patterning technique known in the art.

At 1056, the access transistor may be coupled to the ferroelectric capacitor. Such coupling may take the form of any of the embodiments of the access transistor 110 coupled to the ferroelectric capacitor 120 disclosed herein (e.g., any of the embodiments discussed herein with reference to a source/drain terminal of the access transistor 110 being coupled to one of the electrodes of the ferroelectric capacitor 120). The coupling may be provided at 1056 using any suitable techniques known in the art.

At 1058, the access transistor and the ferroelectric capacitor are coupled to READ and/or WRITE control lines. Such coupling may take the form of any of the embodiments of the access transistor 110 and the ferroelectric capacitor 120 coupled to the WL, PL, and BL disclosed herein (e.g., any of the embodiments discussed herein with reference to the gate terminal of the access transistor 110 is coupled to the WL, one S/D terminal of the access transistor 110 coupled to the BL, the other S/D terminal of the access transistor 110 coupled to one electrode of the ferroelectric capacitor 120, and the other electrode of the ferroelectric capacitor 120 is coupled to the PL). The coupling may be provided at 1058 using any suitable techniques known in the art. In case a diagonal arrangement with diagonal BLs is being implemented, the BL provided at 1058 is formed as to be diagonal with respect to the fin and the WL of the 1T-1FE-CAP memory cell.

The method 1050 may further include other manufacturing operations related to fabrication of other components of the 1T-1FE-CAP cell 100.

Example Electronic Devices

Diagonal arrangements with 1T-1FE-CAP memory cells as disclosed herein may be included in any suitable electronic device. FIGS. 14-18 illustrate various examples of devices and components that may include one or more 1T-1FE-CAP memory cells in any of the diagonal arrangements disclosed herein.

Figures 14A, 14B:
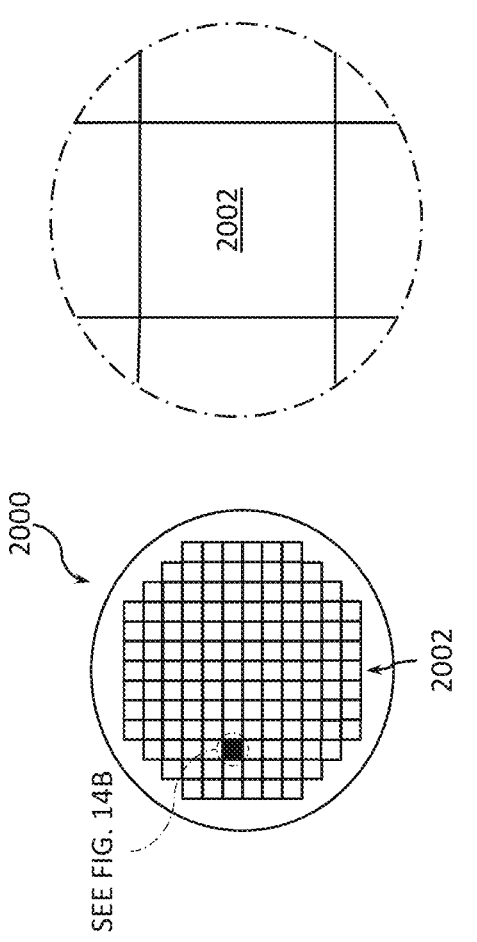
FIGS. 14A-14B are top views of a wafer and dies that include one or more 1T-1FE-CAP memory cells in a diagonal arrangement in accordance with any of the embodiments disclosed herein.

FIGS. 14A-14B are top views of a wafer 2000 and dies 2002 that may include one or more 1T-1FE-CAP memory cells in a diagonal arrangement in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 16. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more 1T-1FE-CAP memory cells in any of the diagonal arrangements described herein). After the fabrication of the semiconductor product is complete (e.g., after manufacture of one or more 1T-1FE-CAP memory cells in any of the diagonal arrangements described herein, e.g., any embodiment of the memory arrays 300 or 600), the wafer 2000 may undergo a singulation process in which each of the dies 2002 is separated from one another to provide discrete "chips" of the semiconductor product. In particular, devices that include one or more 1T-1FE-CAP memory in any of the diagonal arrangements described herein may take the form of the wafer 2000 (e.g., not singulated) or the form of the die 2002 (e.g., singulated). The die 2002 may include a plurality of transistors (e.g., one or more access transistors of the memory arrays 300 and/or 600 as described herein, as well as zero or more front-end-of-line (FEOL) transistors 2140 of FIG. 15, discussed below) and/or supporting circuitry to route electrical signals to the transistors, as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 18) or other logic that is configured to store information in the memory devices or execute instructions stored in the memory array.

Figure 15:
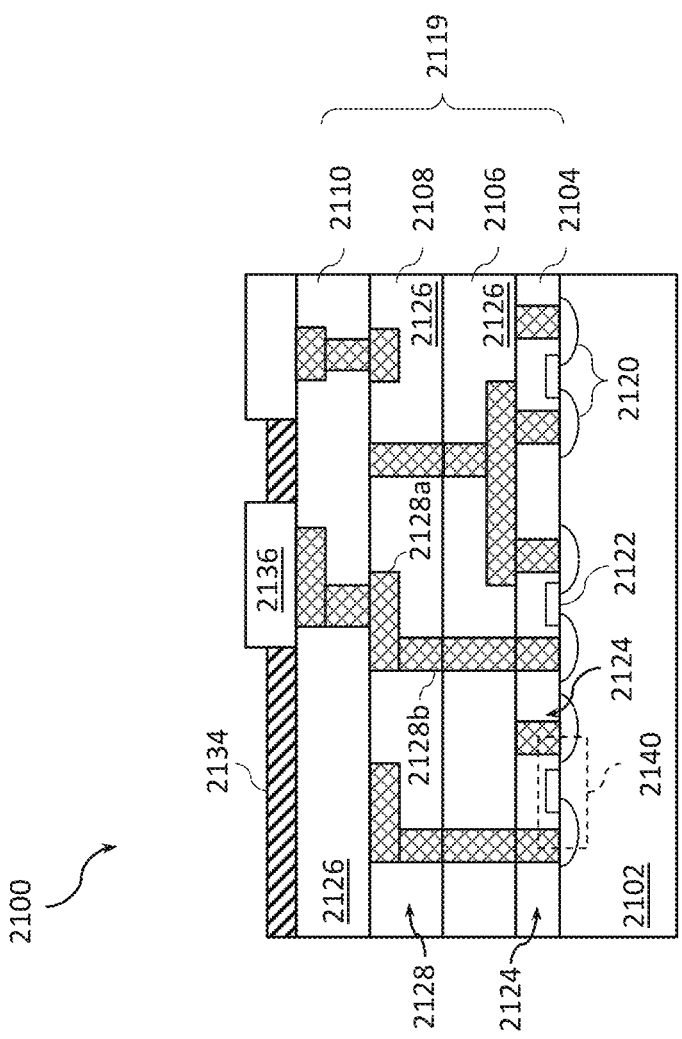
FIG. 15 is a cross-sectional side view of an integrated circuit (IC) device that may include one or more memory arrays implementing one or more 1T-1FE-CAP memory cells in a diagonal arrangement in accordance with any of the embodiments disclosed herein.

FIG. 15 is a cross-sectional side view of an IC device 2100 that may include one or more 1T-1FE-CAP memory cells in a diagonal arrangement in accordance with any of the embodiments disclosed herein. For example, the IC device 2100 may include one or more memory arrays 300 and/or 600 with 1T-1FE-CAP memory cells in diagonal arrangements according to any embodiments described herein. In some embodiments, the IC device 2100 may serve as any of the dies 2256 in the IC package 2200 of FOG. 16.

As shown in FIG. 15, the IC device 2100 may be formed on a substrate 2102 (e.g., the wafer 2000 of FIG. 14A) and may be included in a die (e.g., the die 2002 of FIG. 14B).

The substrate 2102 may include any material that may serve as a foundation for an IC device 2100, or, in general, as a foundation for forming one or more 1T-1FE-CAP memory cells in a diagonal arrangement according to any embodiments described herein. In some embodiments, the substrate 2102 may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate 2102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate 2102 on which logic devices, e.g., the transistors 2140 as shown in FIG. 15, may be formed. In some embodiments, the substrate 2102 may be non-crystalline. In some embodiments, the substrate 2102 may be a printed circuit board (PCB) substrate. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 14B) or a wafer (e.g., the wafer 2000 of FIG. 14A).

The IC device 2100 may include one or more device layers 2104 disposed on the substrate 2102. The device layer 2104 may include features of one or more transistors 2140 (e.g., metal-oxide-semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric 214. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode 212.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Various transistors 2140 are not limited to the type and configuration depicted in FIG. 15 and may include a wide variety of other types and configurations such as, for example, planar transistors, non-planar transistors (e.g., FinFETs, nanowire, or nanoribbon transistors), or a combination of both. In some embodiments, at least some of the transistors 2140 may serve as the access transistors 110 of the 1T-1FE-CAP memory cells in any of the diagonal arrangements described herein.

Electrical signals, such as power and/or input/output (I/O) signals, may be routed to and/or from the transistors 2140 of the device layer 2104 through one or more interconnect layers disposed on the device layer 2104 (illustrated in FIG. 15 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 15). Although a particular number of interconnect layers 2106-1210 is depicted in FIG. 15, embodiments of the present disclosure include IC devices having more or fewer interconnect layers than depicted.

In some embodiments, the interconnect structures 2128 may include trench structures 2125A (sometimes referred to as "lines") and/or via structures 2125B (sometimes referred to as "holes") filled with an electrically conductive material such as a metal. The trench structures 2125A may be arranged to route electrical signals in a direction of a plane that is substantially parallel with a surface of the substrate 2102 upon which the device layer 2104 is formed. For example, the trench structures 2125A may route electrical signals in a direction in and out of the page from the perspective of FIG. 15. The via structures 2125B may be arranged to route electrical signals in a direction of a plane that is substantially perpendicular to the surface of the substrate 2102 upon which the device layer 2104 is formed. In some embodiments, the via structures 2125B may electrically couple trench structures 2125A of different interconnect layers 2106-2110 together.

The interconnect layers 2106-2110 may include a dielectric material 2126 disposed between the interconnect structures 2128, as shown in FIG. 15. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2125A and/or via structures 2125B, as shown. The trench structures 2125A of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2125B to couple the trench structures 2125A of the second interconnect layer 2108 with the trench structures 2125A of the first interconnect layer 2106. Although the trench structures 2125A and the via structures 2125B are structurally delineated with a line within each interconnect layer (e.g., within the second interconnect layer 2108) for the sake of clarity, the trench structures 2125A and the via structures 2125B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

Although not specifically shown in FIG. 15, further metal layers may be present in the IC device 2100.

The IC device 2100 may include a solder resist material 2134 (e.g., polyimide or similar material) and one or more bond pads 2136 formed above the top interconnect layers of the IC device. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 16:
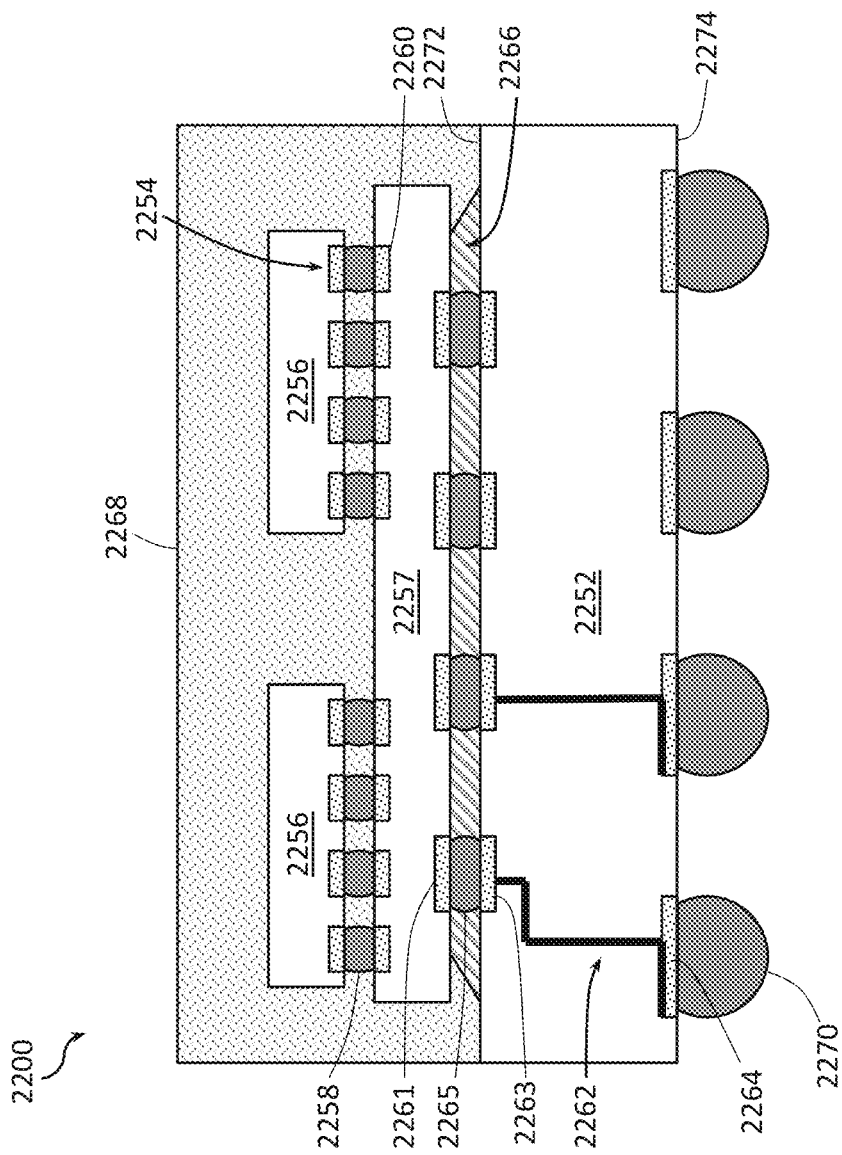
FIG. 16 is a cross-sectional side view of an IC package that may include one or more memory arrays implementing one or more 1T-1FE-CAP memory cells in a diagonal arrangement in accordance with any of the embodiments disclosed herein.

FIG. 16 is a side, cross-sectional view of an example IC package 2200 that may include one or more 1T-1FE-CAP memory cells in a diagonal arrangement in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 15.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 16 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 16 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 16 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 17.

The dies 2256 may take the form of any of the embodiments of the die 2002 discussed herein (e.g., may include any of the embodiments of the memory array 300 of FIG. 3, of the memory array 600 of FIG. 6, the IC device 2100 of FIG. 15, or any combination of these IC devices). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including dies with the IC devices as described herein. In some embodiments, any of the dies 2256 may include one or more 1T-1FE-CAP memory cells in any of the diagonal arrangements described herein; in some embodiments, at least some of the dies 2256 may not include any one or more 1T-1FE-CAP memory cells in a diagonal arrangement.

The IC package 2200 illustrated in FIG. 16 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 16, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 17:
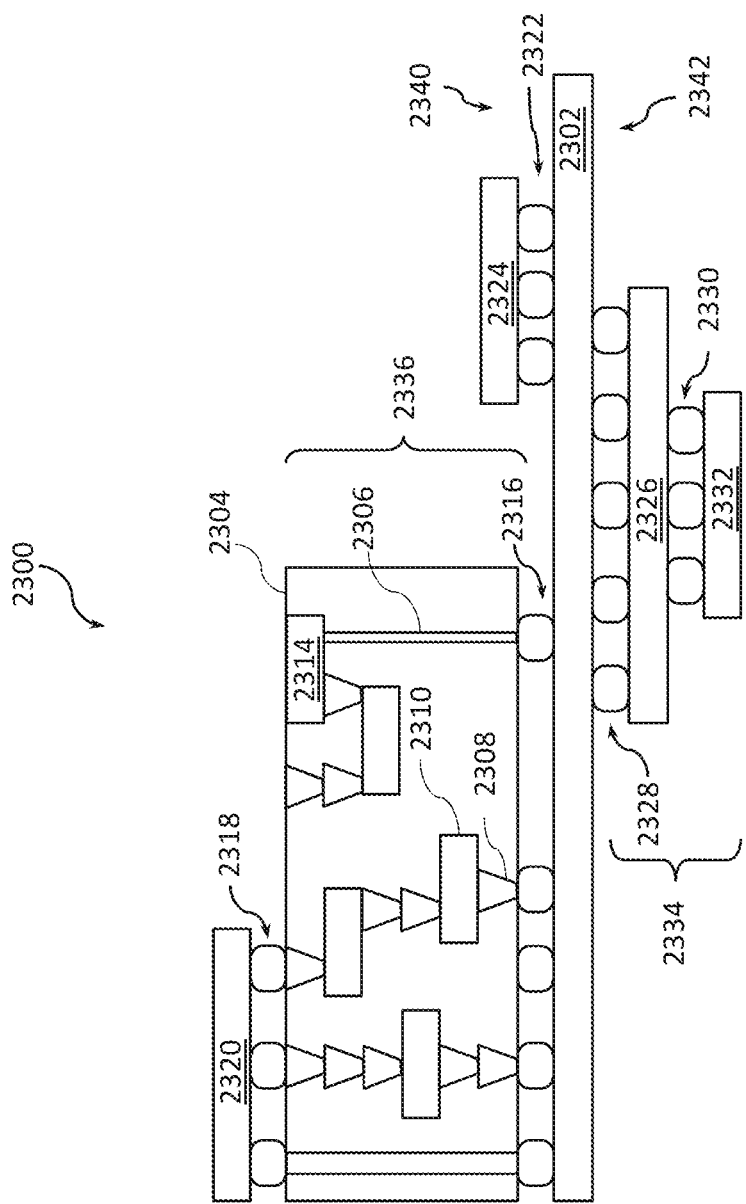
FIG. 17 is a cross-sectional side view of an IC device assembly that may include one or more memory arrays implementing one or more 1T-1FE-CAP memory cells in a diagonal arrangement in accordance with any of the embodiments disclosed herein.

FIG. 17 is a cross-sectional side view of an IC device assembly 2300 that may include components having one or more 1T-1FE-CAP memory cells in a diagonal arrangement in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 1T-1FE-CAP memory cells in a diagonal arrangement in accordance with any of the embodiments disclosed herein; e.g., any of the IC packages discussed below with reference to the IC device assembly 2300 may take the form of any of the embodiments of the IC package 2200 discussed above with reference to FIG. 16 (e.g., may include one or more 1T-1FE-CAP memory cells in any of the diagonal arrangements described herein, provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 17 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 17), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 14B), an IC device (e.g., the memory array 300 of FIG. 3, the memory array 600 of FIG. 6, the IC device 2100 of FIG. 15, or any combination of these IC devices), or any other suitable component. In particular, the IC package 2320 may include one or more 1T-1FE-CAP memory cells in any of the diagonal arrangements described herein. Although a single IC package 2320 is shown in FIG. 17, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 17, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 17 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 18:
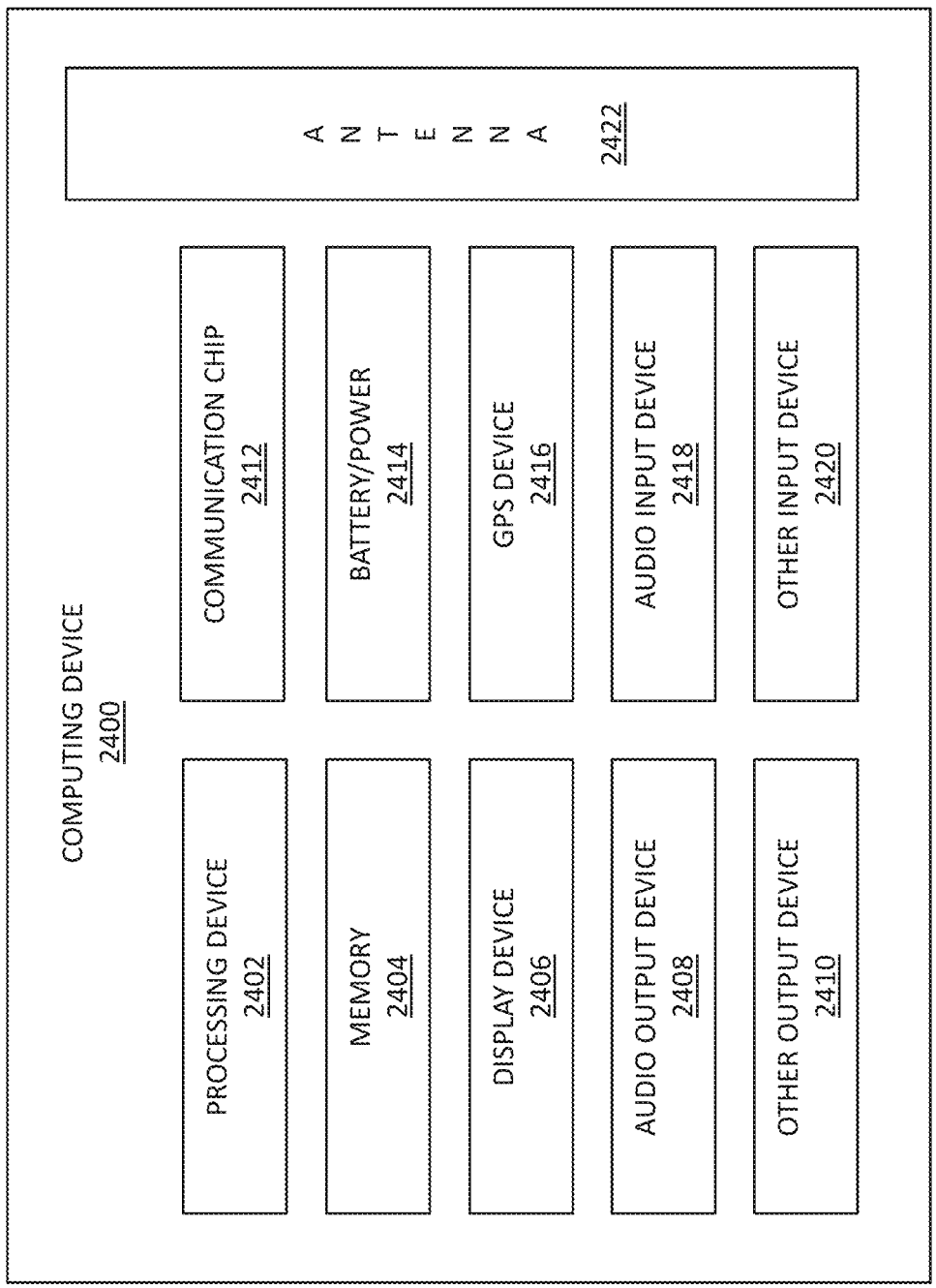
FIG. 18 is a block diagram of an example computing device that may include one or more memory arrays implementing one or more 1T-1FE-CAP memory cells in a diagonal arrangement in accordance with any of the embodiments disclosed herein.

FIG. 18 is a block diagram of an example computing device 2400 that may include one or more components with one or more 1T-1FE-CAP memory cells in a diagonal arrangement in accordance with any of the embodiments disclosed herein. For example, any suitable ones of the components of the computing device 2400 may include a die (e.g., the die 2002 of FIG. 14B) including one or more 1T-1FE-CAP memory cells in a diagonal arrangement in accordance with any of the embodiments disclosed herein. Any of the components of the computing device 2400 may include the memory array 300 of FIG. 3, the memory array 600 of FIG. 6, the IC device 2100 of FIG. 15, any combination of these IC devices, and/or an IC package 2200 of FIG. 16. Any of the components of the computing device 2400 may include an IC device assembly 2300 of FIG. 17.

A number of components are illustrated in FIG. 18 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 18, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), NV memory (e.g., read-only memory (ROM)), flash memory, solid state memory, and/or a hard drive. In some embodiments, the memory 2404 may include memory that shares a die with the processing device 2402. This memory may be used as cache memory and may include embedded memory, e.g. a memory with one or more 1T-1FE-CAP memory cells in any of the diagonal arrangements described herein, and/or spin transfer torque magnetic random-access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides a memory device that includes a transistor (an access transistor) and a ferroelectric capacitor. The ferroelectric capacitor includes a first capacitor electrode, a second capacitor electrode, and a thin-film ferroelectric material between the first and second capacitor electrodes. The transistor includes a fin of a semiconductor material, the fin extending away from a base (i.e., the transistor is a FinFET having a semiconductor material that serves as a channel material being shaped as a fin extending away from a base), and further includes a first S/D terminal coupled to a BL and a second S/D terminal coupled to the second capacitor electrode. Furthermore, a geometrical projection of the BL on a plane parallel to a surface of the base is at an angle between about 5 and 45 degrees with respect to a projection of the fin on the plane.

Example 2 provides the memory device according to example 1, where the projection of the BL on the plane is at an angle between about 10 and 30 degrees with respect to the projection of the fin on the plane.

Example 3 provides the memory device according to examples 1 or 2, further including at least a first interconnect layer and a second interconnect layer above the base, where the first interconnect layer is between the base and the second interconnect layer, and where the BL is in the first interconnect layer, e.g., in the M0 layer.

Example 4 provides the memory device according to example 3, where the second capacitor electrode (i.e., the electrode that is coupled to the second S/D terminal of the transistor) is in the second interconnect layer or in a third interconnect layer that is farther away from the base than the second interconnect layer.

Example 5 provides the memory device according to examples 3 or 4, further including one or more conductive vias extending through at least the first interconnect layer to couple the second capacitor electrode to the second S/D terminal of the transistor (thus, the one or more conductive vias extend from a second or higher interconnect layer all the way down to the fin in order to couple the ferroelectric capacitor to the access transistor).

Example 6 provides the memory device according to any one of the preceding examples, where the BL has a first face and an opposing second face, the first face is closer to the base than the second face, and the memory device further includes an etch stop material over (e.g., in some embodiments, in contact with) at least a portion of the second face of the BL.

Example 7 provides the memory device according to example 6, where the memory device further includes the etch stop material over (e.g., in contact with) at least a portion of at least one sidewall of the BL, and the sidewall extends between the second face and the first face.

Example 8 provides the memory device according to examples 6 or 7, where the memory device further includes a BL contact coupling the BL and the first S/D terminal of the transistor, and where the etch stop material at least partially wraps around the BL and the BL contact.

Example 9 provides the memory device according to any one of the preceding examples, where the transistor further includes a gate terminal coupled to a WL (e.g., the WL at least partially wraps around the fin of the transistor), and the projection of the BL on the plane parallel to the base is at an angle between about 5 and 80 degrees with respect to a projection of the WL on said plane.

Example 10 provides the memory device according to example 9, where the projection of the fin on the plane parallel to the base is substantially orthogonal to the projection of the WL on the plane. This means that if an angle between the projection of the BL and the projection of the fin is a, then the angle between the projection of the BL and the projection of the WL is (90°−α).

Example 11 provides the memory device according to any one of the preceding examples, where the first S/D terminal (i.e., the terminal coupled to the BL) is a source terminal.

Example 12 provides a memory device that includes a transistor (an access transistor) and a ferroelectric capacitor that includes a first capacitor electrode, a second capacitor electrode, and a thin-film ferroelectric material between the first and second capacitor electrodes. The transistor includes a fin of a semiconductor material, the fin extending away from a base (i.e., the transistor is a FinFET having a semiconductor material that serves as a channel material being shaped as a fin extending away from a base). The transistor is coupled to the ferroelectric capacitor. A gate terminal of the transistor is coupled to a WL (e.g., the WL at least partially wraps around the fin of the transistor). A geometrical projection of the WL on a plane parallel to a surface of the base is at an angle between about 5 and 45 degrees with respect to a projection of the fin on the plane.

Example 13 provides the memory device according to example 12, where the projection of the WL on the plane is at an angle between about 10 and 30 degrees with respect to the projection of the fin on the plane.

Example 14 provides the memory device according to examples 12 or 13, where the transistor further includes a first S/D terminal and a second S/D terminal, the transistor is coupled to the ferroelectric capacitor by having the second S/D terminal of the transistor being coupled to the second capacitor electrode, and the first S/D terminal of the transistor is coupled to a BL.

Example 15 provides the memory device according to example 14, where a projection of the BL on the plane is substantially perpendicular to the projection of the WL on the plane.

Example 16 provides the memory device according to examples 14 or 15, where the first S/D terminal (i.e., the terminal coupled to the BL) is a source terminal.

Example 17 provides the memory device according to any one of the preceding examples, where the ferroelectric material includes one or more of: a ferroelectric material comprising hafnium, zirconium, and oxygen (e.g., hafnium zirconium oxide), a ferroelectric material comprising hafnium, silicon, and oxygen (e.g., silicon-doped hafnium oxide), a ferroelectric material comprising hafnium, germanium, and oxygen (e.g., germanium-doped hafnium oxide), a ferroelectric material comprising hafnium, aluminum, and oxygen (e.g., aluminum-doped hafnium oxide), and/or a ferroelectric material comprising hafnium, yttrium, and oxygen (e.g., yttrium-doped hafnium oxide).

Example 18 provides the memory device according to any one of the preceding examples, where the ferroelectric material has a thickness between about 1 nanometer and 10 nanometers (i.e., the ferroelectric material is a thin-film ferroelectric material).

Example 19 provides the memory device according to any one of the preceding examples, where the first capacitor electrode is coupled to a PL.

Example 20 provides the memory device according to any one of the preceding examples, where the ferroelectric capacitor is both programmable and readable by the transistor.

Example 21 provides a method of operating a memory device that includes an access transistor and a ferroelectric capacitor. The method includes driving a WL, coupled to a gate terminal of the access transistor, to cause the access transistor to turn on; and programming the ferroelectric capacitor by, when the access transistor is turned on, driving a BL coupled to a first S/D terminal of the access transistor to charge or discharge an intermediate node coupled to a second S/D terminal of the access transistor, where the ferroelectric capacitor is coupled to and programmable according to a charge on the intermediate node. The access transistor includes a fin of a semiconductor material, and either a geometrical projection of the BL on a plane parallel to a surface of a substrate over which the memory device is provided is at an angle between about 5 and 45 degrees with respect to a geometrical projection of the fin on the plane, or a geometrical projection of the WL on said plane is at an angle between about 5 and 45 degrees with respect to the projection of the fin on the plane.

Example 22 provides the method according to example 21, where a first capacitor electrode of the ferroelectric capacitor is coupled to a PL, a second capacitor electrode of the ferroelectric capacitor is coupled to the intermediate node, and the ferroelectric material is disposed between the first capacitor electrode and the second capacitor electrode.

Example 23 provides the method according to example 22, where programming the ferroelectric capacitor includes applying a first voltage to the PL to generate an electric field across the ferroelectric material.

Example 24 provides the method according to example 23, where driving the WL and driving the BL are performed after applying the first voltage to the PL.

Example 25 provides the method according to examples 23 or 24, where application of the first voltage to the PL causes a first logic state to be programmed on the ferroelectric capacitor, the method further including applying a second voltage to the PL after applying the first voltage to the PL, where application of the second voltage to the PL together with driving the WL and the BL causes a second logic state to be programmed on the ferroelectric capacitor.

Example 26 provides the method according to example 22, where programming the ferroelectric capacitor includes applying a first voltage to the PL to ensure that a polarization of the ferroelectric material corresponds to a first logic state. The method further includes, after applying the first voltage, applying a second voltage to the PL, the second voltage being insufficient to switch the polarization of the ferroelectric material. The method also includes driving the WL and the BL for a suitable duration to charge or discharge the intermediate node so that a charge on the intermediate node together with the second voltage applied to the PL is sufficient to switch the polarization of the ferroelectric material from the first logic state to the second logic state.

Example 27 provides the method according to any one of examples 21-24 and 26, further including reading the ferroelectric capacitor by sensing the BL to determine a logic state programmed in the ferroelectric capacitor.

Example 28 provides a method of operating a memory device including an access transistor and a ferroelectric capacitor provided. The method includes driving a WL, coupled to a gate terminal of the access transistor, to cause the access transistor to turn on and to cause a current on a BL through the access transistor, where the access transistor and the ferroelectric capacitor are coupled in electrical series by having one capacitor electrode of the ferroelectric capacitor being coupled to a source terminal or a drain terminal of the access transistor. The method also includes driving a PL coupled to another capacitor electrode of the ferroelectric capacitor to set a polarization state of the ferroelectric capacitor to a predefined logic state, reading the ferroelectric capacitor by sensing the current on the BL to determine a logic state that was programmed in the ferroelectric capacitor prior to the polarization state of the ferroelectric capacitor being set to the predefined logic state. The access transistor includes a fin of a semiconductor material, and either a geometrical projection of the BL on a plane parallel to a surface of a substrate over which the memory device is provided is at an angle between about 5 and 45 degrees with respect to a geometrical projection of the fin on said plane, or a geometrical projection of the WL on said plane is at an angle between about 5 and 45 degrees with respect to the projection of the fin on said plane.

Example 29 provides the method according to example 28, where the ferroelectric material includes one or more of hafnium zirconium oxide, silicon-doped hafnium oxide, germanium-doped hafnium oxide, aluminum-doped hafnium oxide, and yttrium-doped hafnium oxide.

Example 30 provides the method according to any one of examples 21-29, where the memory device is a memory device according to any one of examples 1-20.

Example 31 provides a computing device that includes a package substrate and an IC die coupled to the package substrate. The IC die includes a plurality of memory devices, where individual ones of the plurality of memory devices are memory devices according to any one of the preceding examples (e.g., any one of examples 1-20).

Example 32 provides the computing device according to example 31, where the computing device is a wearable or handheld computing device.

Example 33 provides the computing device according to examples 31 or 32, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:
1. An integrated circuit (IC) device, comprising:
 a base; and
 a plurality of memory cells, each memory cell comprising:
  a transistor, and
  a capacitor comprising a first capacitor electrode, a second capacitor electrode, and a ferroelectric material between the first and second capacitor electrodes, where the transistor includes a first source/drain (S/D) terminal coupled to a bitline (BL) and further includes a second S/D terminal coupled to the capacitor,
 wherein:
  a second S/D terminal of a first memory cell of the plurality of memory cells is closer to a second S/D terminal of a second memory cell of the plurality of memory cells than the first S/D terminal of the first memory cell,
  the second SID terminal of the second memory cell is closer to the second S/D terminal of the first memory cell than the first S/D terminal of the second memory cell,
  a transistor of the first memory cell and a transistor of the second memory cell include a continuous fin of a semiconductor material, the fin extending away from the base,
  a projection of the BL onto the base is at an angle between 5 and 45 degrees with respect to an edge of the base, and
  a projection of the fin onto the base is at an angle of substantially 90 degrees with respect to the edge of the base.

2. The IC device according to claim 1, wherein the projection of the BL onto the base is at an angle between 10 and 30 degrees with respect to the projection of the fin onto the base.

3. The IC device according to claim 1, further comprising at least a first interconnect layer and a second interconnect layer above the base, wherein the first interconnect layer is between the base and the second interconnect layer, and wherein the BL is in the first interconnect layer.

4. The IC device according to claim 3, wherein the second capacitor electrode is in the second interconnect layer or in a third interconnect layer that is farther away from the base than the second interconnect layer.

5. The IC device according to claim 3, further comprising one or more conductive vias extending through at least the first interconnect layer to couple the second capacitor electrode to the second S/D terminal of the transistor of the first memory cell.

6. The IC device according to claim 1, wherein the BL has a first face and an opposing second face, the first face is closer to the base than the second face, and the memory device further includes an etch stop material over at least a portion of the second face of the BL.

7. The IC device according to claim 6, wherein the memory device further includes the etch stop material over at least a portion of at least one sidewall of the BL, and the sidewall extends between the second face and the first face.

8. The IC device according to claim 6, wherein the memory device further includes a BL contact coupling the BL and the first S/D terminal of the transistor of the first memory cell, and wherein the etch stop material at least partially wraps around the BL and the BL contact.

9. The IC device according to claim 1, wherein the transistor of the first memory cell further includes a gate terminal coupled to a wordline (WL), and wherein the projection of the fin onto the base is perpendicular to a projection of the WL onto the base.

10. The IC device according to claim 1, wherein the first S/D terminal is a source terminal.

11. The IC device according to claim 1, wherein the ferroelectric material comprises one or more of:
   a ferroelectric material comprising hafnium, zirconium, and oxygen;
   a ferroelectric material comprising hafnium, silicon, and oxygen;
   a ferroelectric material comprising hafnium, germanium, and oxygen;
   a ferroelectric material comprising hafnium, aluminum, and oxygen; or
   a ferroelectric material comprising hafnium, yttrium, and oxygen.

12. The IC device according to claim 1, wherein the ferroelectric material has a thickness between 1 nanometer and 10 nanometers.

13. The IC device according to claim 1, wherein the first capacitor electrode is coupled to a plateline.

14. The IC device according to claim 1, further comprising a package substrate and an IC die coupled to the package substrate, wherein the IC die includes the base and the plurality of memory cells.

15. The IC device according to claim 1, wherein the IC device is a computing device.

16. The IC device according to claim 15, wherein the computing device is a wearable device or a handheld computing device.

17. The IC device according to claim 1, wherein the IC device is a wearable device or a handheld computing device.

18. A method of operating a memory device comprising a base, a first memory cell, and a second memory cell, each of the first memory cell and the second memory cell comprising a transistor and a capacitor, the transistor including a first source/drain (S/D) terminal and a second S/D terminal, the method comprising:
   driving a wordline (WL), coupled to a gate terminal of the transistor of the first memory cell, to cause the transistor of the first memory cell to turn on; and
   programming the capacitor of the first memory cell by, when the transistor of the first memory cell is turned on, driving a bitline (BL) coupled to the first S/D terminal of the transistor of the first memory cell to charge or discharge an intermediate node coupled to the second S/D terminal of the transistor of the first memory cell, wherein:
      the second S/D terminal of the first memory cell is closer to the second S/D terminal of the second memory cell than the first S/D terminal of the first memory cell,
      the second S/D terminal of the second memory cell is closer to the second S/D terminal of the first memory cell than the first S/D terminal of the second memory cell,
      the transistor of the first memory cell and the transistor of the second memory cell includes a continuous fin of a semiconductor material, the fin extending away from the base,
      a projection of the WL onto the base is substantially perpendicular to a projection of the fin onto the base, and
      a projection of the BL onto the base is at an angle between 5 and 45 degrees with respect to the projection of the fin onto the base.

19. The method according to claim 18, wherein a first capacitor electrode of the capacitor of the first memory cell is coupled to a plateline (PL), a second capacitor electrode of the capacitor of the first memory cell is coupled to the intermediate node, and a ferroelectric material is between the first capacitor electrode and the second capacitor electrode.

20. The method according to claim 19, wherein programming the capacitor of the first memory cell includes applying a first voltage to the PL to generate an electric field across the ferroelectric material, and wherein driving the WL and driving the BL are performed after applying the first voltage to the PL.

21. The method according to claim 20, wherein application of the first voltage to the PL causes a first logic state to be programmed on the capacitor of the first memory cell, the method further comprising applying a second voltage to the PL after applying the first voltage to the PL, wherein application of the second voltage to the PL together with driving the WL and the BL causes a second logic state to be programmed on the capacitor of the first memory cell.

22. The method according to claim 19, wherein programming the capacitor of the first memory cell comprises:
   applying a first voltage to the PL to ensure that a polarization of the ferroelectric material corresponds to a first logic state,
   after applying the first voltage, applying a second voltage to the PL, the second voltage being insufficient to switch the polarization of the ferroelectric material, and
   driving the WL and the BL for a suitable duration to charge or discharge the intermediate node so that a charge on the intermediate node together with the second voltage applied to the PL is sufficient to switch the polarization of the ferroelectric material from the first logic state to the second logic state.

23. The method according to claim 22, further comprising reading the capacitor of the first memory cell by sensing the BL to determine a logic state programmed in the capacitor of the first memory cell.

24. A method of operating a memory device comprising a base, a first memory cell, and a second memory cell, each of the first memory cell and the second memory cell comprising a transistor and a capacitor, the transistor including a first source/drain (S/D) terminal and a second S/D terminal, the method comprising:
   driving a wordline (WL), coupled to a gate terminal of the transistor of the first memory cell, to cause the transistor of the first memory cell to turn on and to cause a current on a bitline (BL) through the transistor of the first memory cell, wherein the transistor of the first memory cell and the capacitor of the first memory cell are coupled in series by having one capacitor electrode of the capacitor being coupled to either the first S/D terminal or the second S/D terminal of the transistor of the first memory cell;
   driving a plateline (PL) coupled to another capacitor electrode of the capacitor of the first memory cell to set a polarization state of the capacitor of the first memory cell to a predefined logic state; and
   reading the capacitor of the first memory cell by sensing the current on the BL to determine a logic state that was programmed in the capacitor of the first memory cell prior to the polarization state of the capacitor of the first memory cell being set to the predefined logic state, wherein:
    the second S/D terminal of the first memory cell is closer to the second S/D terminal of the second memory cell than the first S/D terminal of the first memory cell,
    the second S/D terminal of the second memory cell is closer to the second S/D terminal of the first memory cell than the first S/D terminal of the second memory cell,
    the transistor of the first memory cell and the transistor of the second memory cell includes a continuous fin of a semiconductor material, the fin extending away from the base,
    a projection of the WL onto the base is substantially perpendicular to a projection of the fin onto the base, and
    a projection of the BL onto the base is at an angle between 5 and 45 degrees with respect to the projection of the fin onto the base.

25. The method according to claim 24, wherein the capacitor of the first memory cell includes a first capacitor electrode, a second capacitor electrode, and a ferroelectric material between the first and second capacitor electrodes, and wherein the ferroelectric material comprises one or more of hafnium zirconium oxide, silicon-doped hafnium oxide, germanium-doped hafnium oxide, aluminum-doped hafnium oxide, and yttrium-doped hafnium oxide.

\* \* \* \* \*

UNITED STATES PATENT AND TRADEMARK OFFICE
CERTIFICATE OF CORRECTION

| | |
|---|---|
| PATENT NO. | : 11,450,675 B2 |
| APPLICATION NO. | : 16/132281 |
| DATED | : September 20, 2022 |
| INVENTOR(S) | : Daniel H. Morris et al. |

It is certified that error appears in the above-identified patent and that said Letters Patent is hereby corrected as shown below:

In the Claims

In Column 38, Claim 1, Line 20, delete "SID" and insert -- S/D --, therefor.

Signed and Sealed this
Fourth Day of April, 2023

Katherine Kelly Vidal
*Director of the United States Patent and Trademark Office*